US012628327B2

(12) United States Patent
Yu et al.

(10) Patent No.: US 12,628,327 B2
(45) Date of Patent: May 12, 2026

(54) SRAM DEVICE FOR FPGA APPLICATION

(71) Applicant: Taiwan Semiconductor Manufacturing Company, Ltd., Hsinchu (TW)

(72) Inventors: Dian-Sheng Yu, Hsinchu City (TW); Chun-Wei Chang, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 858 days.

(21) Appl. No.: 17/668,196

(22) Filed: Feb. 9, 2022

(65) Prior Publication Data

US 2023/0008349 A1     Jan. 12, 2023

Related U.S. Application Data

(60) Provisional application No. 63/219,939, filed on Jul. 9, 2021.

(51) Int. Cl.
*H10B 10/00*        (2023.01)

(52) U.S. Cl.
CPC .................................... *H10B 10/12* (2023.02)

(58) Field of Classification Search
None
See application file for complete search history.

(56) References Cited

U.S. PATENT DOCUMENTS

| | | | | |
|---|---|---|---|---|
| 7,417,918 B1* | 8/2008 | Hao | ....................... | G11C 29/02 |
| | | | | 326/46 |
| 2004/0017724 A1* | 1/2004 | Kubota | ............... | G06F 15/7867 |
| | | | | 365/222 |
| 2012/0012896 A1* | 1/2012 | Venkatraman | ......... | H10B 10/00 |
| | | | | 257/E27.06 |
| 2013/0258759 A1* | 10/2013 | Liaw | ..................... | G06F 30/392 |
| | | | | 257/E21.53 |
| 2013/0314976 A1* | 11/2013 | Onuki | ..................... | G11C 11/40 |
| | | | | 365/149 |
| 2014/0003133 A1* | 1/2014 | Lin | ........................ | G06F 30/392 |
| | | | | 716/55 |
| 2014/0133218 A1* | 5/2014 | Liaw | ..................... | G11C 11/412 |
| | | | | 438/283 |
| 2014/0151812 A1* | 6/2014 | Liaw | ..................... | H10D 89/10 |
| | | | | 438/672 |

(Continued)

FOREIGN PATENT DOCUMENTS

| | | |
|---|---|---|
| CN | 109407816 A | 3/2019 |
| TW | 202040579 A | 11/2020 |
| TW | 202105402 A | 2/2021 |

*Primary Examiner* — Jessica S Manno
*Assistant Examiner* — Christopher A. Schodde
(74) *Attorney, Agent, or Firm* — HAYNES AND BOONE, LLP

(57) ABSTRACT

A device includes a first transistor including a first drain/source terminal and a second transistor including a first gate terminal. A first conductive path is electrically connected between the first drain/source terminal and the first gate terminal. The first conductive path includes a first conductive via electrically connected between the first drain/source terminal and a first track of a first conductive layer, and a second conductive via electrically connected between the first track of the first conductive layer and a first track of a second conductive layer.

20 Claims, 17 Drawing Sheets

(56) References Cited

U.S. PATENT DOCUMENTS

| | | | | |
|---|---|---|---|---|
| 2015/0371701 A1* | 12/2015 | Liaw | .................... | G11C 11/412 |
| | | | | 365/51 |
| 2017/0033102 A1* | 2/2017 | Kim | .................... | H01L 27/0207 |
| 2018/0122812 A1* | 5/2018 | Liaw | .................. | H01L 27/0207 |
| 2019/0198491 A1* | 6/2019 | Do | ...................... | H01L 23/5221 |
| 2020/0051659 A1 | 2/2020 | Matsubara | | |
| 2020/0105671 A1* | 4/2020 | Lai | ......................... | G06F 30/39 |
| 2020/0363989 A1* | 11/2020 | Li | ....................... | G11C 11/5628 |
| 2021/0082475 A1* | 3/2021 | Chen | .................. | H01L 23/5226 |

* cited by examiner

Cell B

Cell A

Cell B

Cell A

Cell B

Providing a first transistor including a first drain/source terminal ~700

Providing a second transistor including a first gate terminal ~702

Connecting a first conductive via between the first drain/source terminal and a first conductive layer ~704

Connecting a second conductive via between the first conductive layer and a second conductive layer ~706

SRAM DEVICE FOR FPGA APPLICATION

CROSS-REFERENCE TO RELATED APPLICATIONS

This application claims the benefit of U.S. Provisional Patent Application No. 63/219,939, filed on Jul. 9, 2021, the disclosure of which is incorporated by reference in its entirety.

BACKGROUND

Typically, a static random-access memory (SRAM) has an array of memory cells that include transistors connected between an upper reference potential and a lower reference potential, such that one of two storage nodes stores information to be stored and the other storage node stores the complementary information. One SRAM memory cell arrangement includes six transistors, where each bit of information is stored on four of the transistors that form two cross-coupled inverters. The other two transistors are connected to the memory cell word line to control access to the memory cell during read and write operations by selectively connecting the memory cell to a bit line BL and a bit line bar, i.e., an inverted bit line, BLB. Since SRAM is volatile memory, data is lost when power is removed from the SRAM. As a result, SRAM-based field programmable gate array (FPGA) devices include additional components, such as a configuration device and non-volatile memory, to store data from the SRAM at power down and load data into the SRAM at power up. SRAM-based FPGA devices continue being developed to improve performance and lower costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
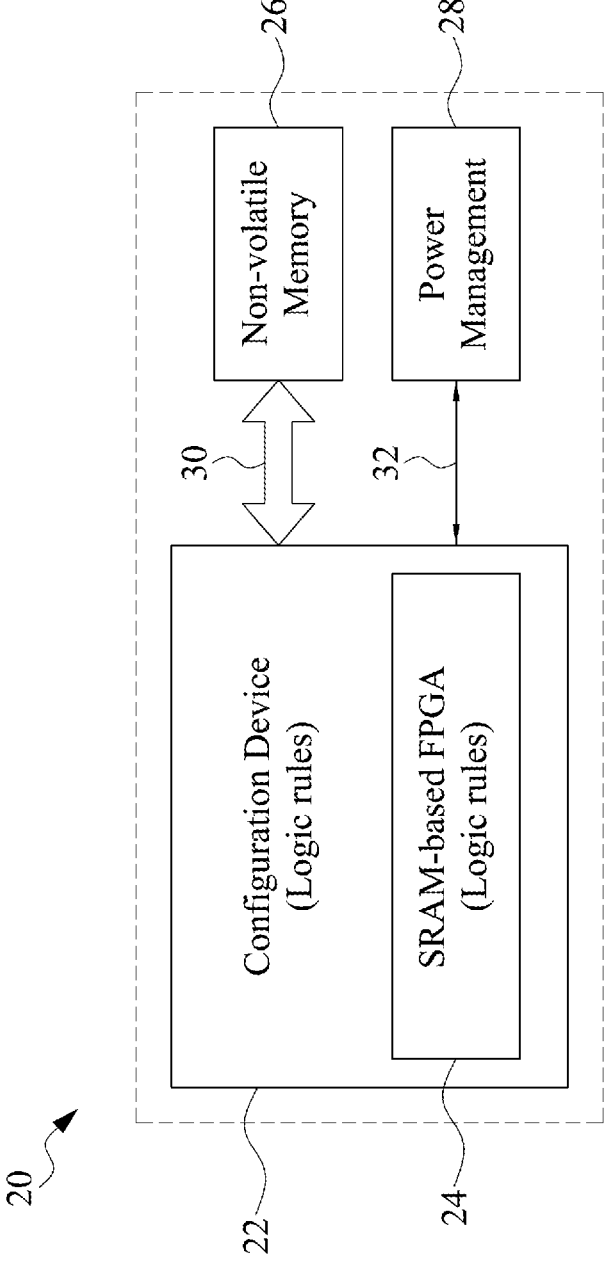
FIG. 1 is a diagram schematically illustrating an SRAM-based FPGA device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An SRAM-based FPGA may be designed and manufactured in accordance with SRAM rules and technology, and a configuration device for storing data from the SRAM at power down and loading data into the SRAM at power up is designed and manufactured in accordance with logic rules and technology. Often, due to differences in the SRAM rules and the logic rules, it is not easy to integrate the SRAM-based FPGA with the configuration device or with other peripheral logic devices, such as programmable logic devices. For example, power, performance, and area (PPA) may be adversely affected in scaling of the technology due to additional connection regions provided between the SRAM-based FPGA and the logic devices. Also, other items may adversely affect the PPA including fin field-effect-transistors (finfets) with different cell heights, middle-end-of-line (MEOL) pattern uniformity issues, and back-end-of-line (BEOL) power and reference lines not lining up with the circuits or being off track.

To eliminate these issues, disclosed embodiments provide that both the SRAM-based FPGA and the configuration device are designed and manufactured in accordance with the logic rules and technology. The SRAM-based FPGA designed and manufactured with the logic rules and technology is more easily integrated with the configuration device and with other peripheral logic devices. Also, both the SRAM-based FPGA and the configuration device can be made to comply with custom logic design rules for meeting PPA goals.

As used herein, "the logic rules and technology" refers to rules and technology for designing and laying out a logic device, and "the SRAM rules and technology" refers to rules and technology for designing and laying out an SRAM. For example, the SRAM rules and the logic rules include different spacing and/or pattern dimensions. Where, in general, the logic rules may have smaller spacing requirements than the SRAM rules.

In disclosed embodiments, the SRAM-based FPGA and the configuration devices designed and manufactured in accordance with the logic rules and technology provide more robust power line and reference (ground) line tracks and benefit from front-end-of-line (FEOL), MEOL, and BEOL simple abutment with neighboring logic devices, such that the SRAM-based FPGA and the configuration devices can be situated directly adjacent each other and the neighboring logic devices. For example, the finfets in the SRAM-based FPGA and the configuration devices have the same cell height, such that integration and direct abutment is possible. Also, the FEOL/MEOL/BEOL patterns provide uniformity of lines and "space push" defined herein as consolidation of wiring and layouts within a limited space.

In some embodiments, extreme ultraviolet (EUV) lithography is used to pattern the FEOL/MEOL/BEOL layers. Also, in some embodiments, the SRAM-based FPGA and the configuration device designed and manufactured in accordance with the logic rules and technology can be implemented using finfet technology and, in some embodiments, using stacked nanosheet transistor technology.

Disclosed embodiments include a six transistor (6T) SRAM circuit designed and manufactured in accordance with the logic rules and technology. The 6T SRAM circuit includes MEOL contacts or vias to BEOL conductive layers, such as metal layers, for nodal connections. Disclosed embodiments further include a first circuit layout of the 6T SRAM circuit, cell A, and a second circuit layout of the 6T SRAM circuit, cell B. In each of cell A and cell B, the 6T SRAM circuit includes MEOL contacts or vias to BEOL conductive layers to provide conductive paths in the 6T SRAM circuit that are resistance/capacitance (RC) balanced paths. These balanced paths in the SRAM circuit reduce mismatch and provide better circuit operation margins. Also, each of cell A and cell B includes conductive tracks, such as first metal layer (M0) tracks, that align with the power and reference (ground) lines to provide more robust connections to the power and reference lines. In some embodiments, the 6T SRAM circuit layouts can be directly connected, without a jumper, to other logic devices, which provides improved PPA. In some embodiments, EUV lithography provides pattern uniformity that benefits providing MEOL contacts or vias to BEOL conductive layers.

FIG. 1 is a diagram schematically illustrating an SRAM-based FPGA device 20, in accordance with some embodiments. The SRAM-based FPGA device 20 includes a configuration device 22, an SRAM-based FPGA 24, a non-volatile memory 26, and a power management circuit 28. Each of the configuration device 22 and the SRAM-based FPGA 24 are designed and manufactured in accordance with the logic rules and technology. In some embodiments, the SRAM-based FPGA device 20 is configured to be used in a real-time clock system application.

The configuration device 22 is electrically connected to the non-volatile memory 26 via communications path 30 and to the power management circuit 28 via communications path 32. The power management circuit 28 is configured to manage power to the configuration device 22 and to the SRAM-based FPGA 24. In some embodiments, the non-volatile memory 26 includes flash memory.

The configuration device 22 is further electrically connected to the SRAM-based FPGA 24. In some embodiments, the SRAM-based FPGA 24 is integrated into the configuration device 22. In other embodiments, the SRAM-based FPGA 24 is situated adjacent or alongside the configuration device 22.

The configuration device 22 is configured to load data into the SRAM-based FPGA 24 from the non-volatile memory 26 at power up and, in some embodiments, the configuration device 22 is configured to store data from the SRAM-based FPGA 24 into the non-volatile memory 26 at power down.

The SRAM-based FPGA 24 designed and manufactured with the logic rules and technology is easily integrated into the configuration device 22 and electrically connected to other logic devices. Also, both the SRAM-based FPGA 24 and the configuration device 22 can be made to comply with custom logic design rules for meeting PPA goals.

Figure 2:
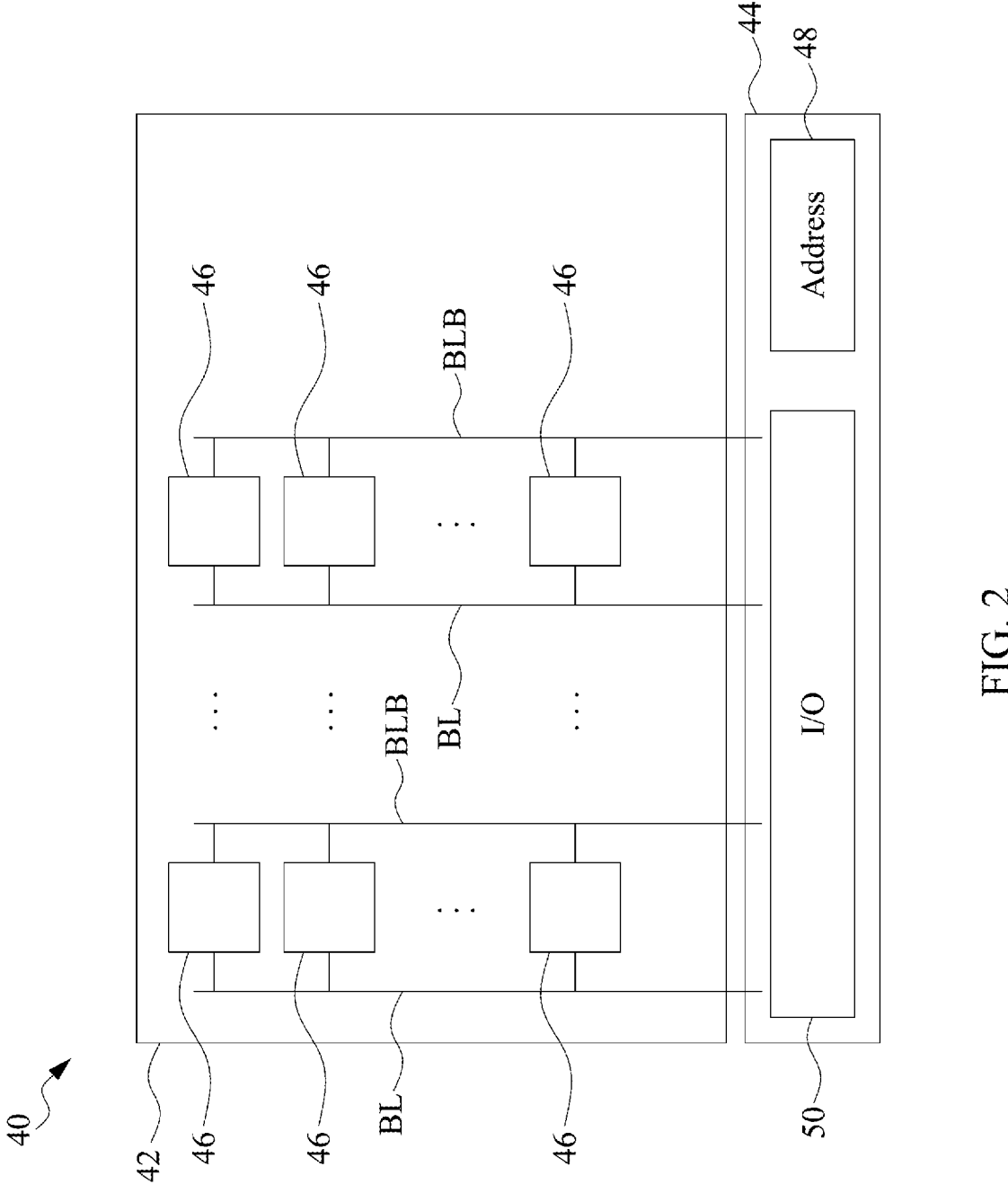
FIG. 2 is a block diagram schematically illustrating an SRAM, in accordance with some embodiments.

FIG. 2 is a block diagram schematically illustrating an SRAM device 40, in accordance with some embodiments. The SRAM device 40 is designed and manufactured in accordance with the logic rules and technology. In some embodiments, the SRAM device 40 is like the SRAM-based FPGA 24 (shown in FIG. 1). In some embodiments, the SRAM device 40 is part of the SRAM-based FPGA device 20 of FIG. 1.

The SRAM device 40 includes an SRAM memory array 42 and peripheral circuits 44 located peripherally to the SRAM memory array 42. The SRAM memory array 42 includes a plurality of SRAM memory cells 46. Each of the SRAM memory cells 46 is connected to a bit line BL and a bit line bar BLB for reading and writing the SRAM memory cell 46.

The peripheral circuits 44 include address circuits 48 and input/output (I/O) circuits 50. The address circuits 48 are for addressing the SRAM memory cells 46 and, in some embodiments, include row and column decoder circuits. The I/O circuits 50 are for reading the SRAM memory cells 46 and outputting sensed data, and for writing input data into the SRAM memory cells 46. The I/O circuits 50 are electrically coupled to the SRAM memory cells 46 by the bit lines BLs and the bit line bars BLBs, such that data is read from and written into the SRAM memory cells 46 via the bit lines BLs and the bit line bars BLB. The I/O circuits 50 include sense amplifiers for reading and writing the SRAM memory cells 46.

Figure 3A:
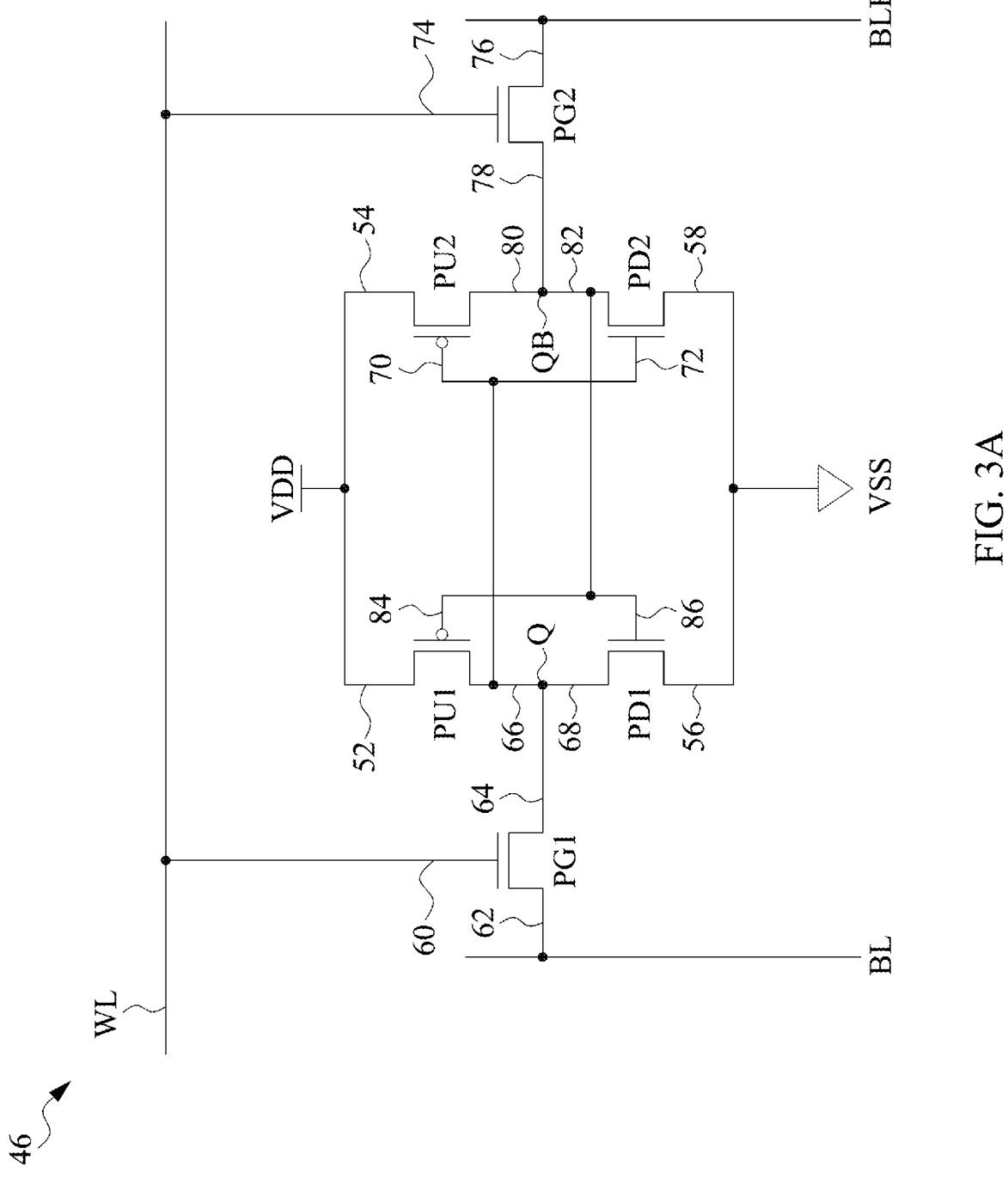
FIG. 3A is a diagram schematically illustrating one of the SRAM memory cells, in accordance with some embodiments.

FIG. 3A is a diagram schematically illustrating one of the SRAM memory cells 46, in accordance with some embodiments. The SRAM memory cell 46 is a 6T SRAM memory cell. In other embodiments, the SRAM memory cell 46 can be a different SRAM memory cell. In some embodiments, the SRAM memory cell 46 includes more than six transistors. In some embodiments, the SRAM memory cell 46 includes fewer than six transistors. In some embodiments, the SRAM memory cell 46 is one of a four transistor (4T), eight transistor (8T), or ten transistor (10T) memory cell and, in some embodiments, the SRAM memory cell 46 includes a memory-like bit-cell or a building unit.

The 6T SRAM memory cell 46 includes four n-type metal-oxide-semiconductor (NMOS) field-effect transistors, and two p-type metal-oxide semiconductor (PMOS) field-effect transistors. The 6T SRAM memory cell 46 includes a first inverter formed by a first PMOS/NMOS transistor pair including a first PMOS pull-up transistor PU1 and a first NMOS pull-down transistor PD1, a second inverter formed by a second PMOS/NMOS transistor pair including a second PMOS pull-up transistor PU2 and a second NMOS pull-down transistor PD2, and two access transistors or pass gates including a first NMOS pass gate transistor PG1 and a second NMOS pass gate transistor PG2.

The first and second inverters are cross coupled to each other to form a latch circuit for data storage. First drain/source terminals 52 and 54 of each of transistors PU1 and PU2 is coupled to a power supply VDD, and first drain/source terminals 56 and 58 of each of transistors PD1 and PD2 is coupled to a reference voltage VSS, such as ground.

The gate terminal 60 of the first pass gate transistor PG1 is coupled to a word line WL and a first drain/source terminal 62 of the first pass gate transistor PG1 is coupled to the bit line BL. Also, a second drain/source terminal 64 of the pass gate transistor PG1 is coupled to second drain/source terminals 66 and 68 of transistors PU1 and PD1 and to gate terminals 70 and 72 of PU2 and PD2 at node Q.

The gate terminal 74 of the second pass gate transistor PG2 is coupled to the word line WL and a first drain/source terminal 76 of the second pass gate transistor PG2 is coupled to the bit line bar BLB. Also, a second drain/source terminal 78 of the pass gate transistor PG2 is coupled to second drain/source terminals 80 and 82 of transistors PU2 and PD2 and to gate terminals 84 and 86 of PU1 and PD1 at node QB.

During a read operation, the bit line BL and the bit line bar BLB are pre-charged to a predefined voltage. The word line WL is enabled and a sense amplifier (not shown) is connected to the bit line BL and the bit line bar BLB to sense voltages on the bit line BL and the bit line bar BLB and output stored information.

During a write operation, the bit line BL and the bit line bar BLB are set to a voltage corresponding to the data to be stored. Bit line and bit line bar input-drivers are stronger than the transistors in the SRAM memory cell 46, such that when the word line is enabled, the write voltages override the cross-coupled inverter voltages in the memory cell to write the SRAM memory cell 46.

In some embodiments, the SRAM memory cell 46 can be manufactured using finfets and, in some embodiments, the SRAM memory cell 46 can be manufactured using stacked nanosheet transistors.

Figure 3B:
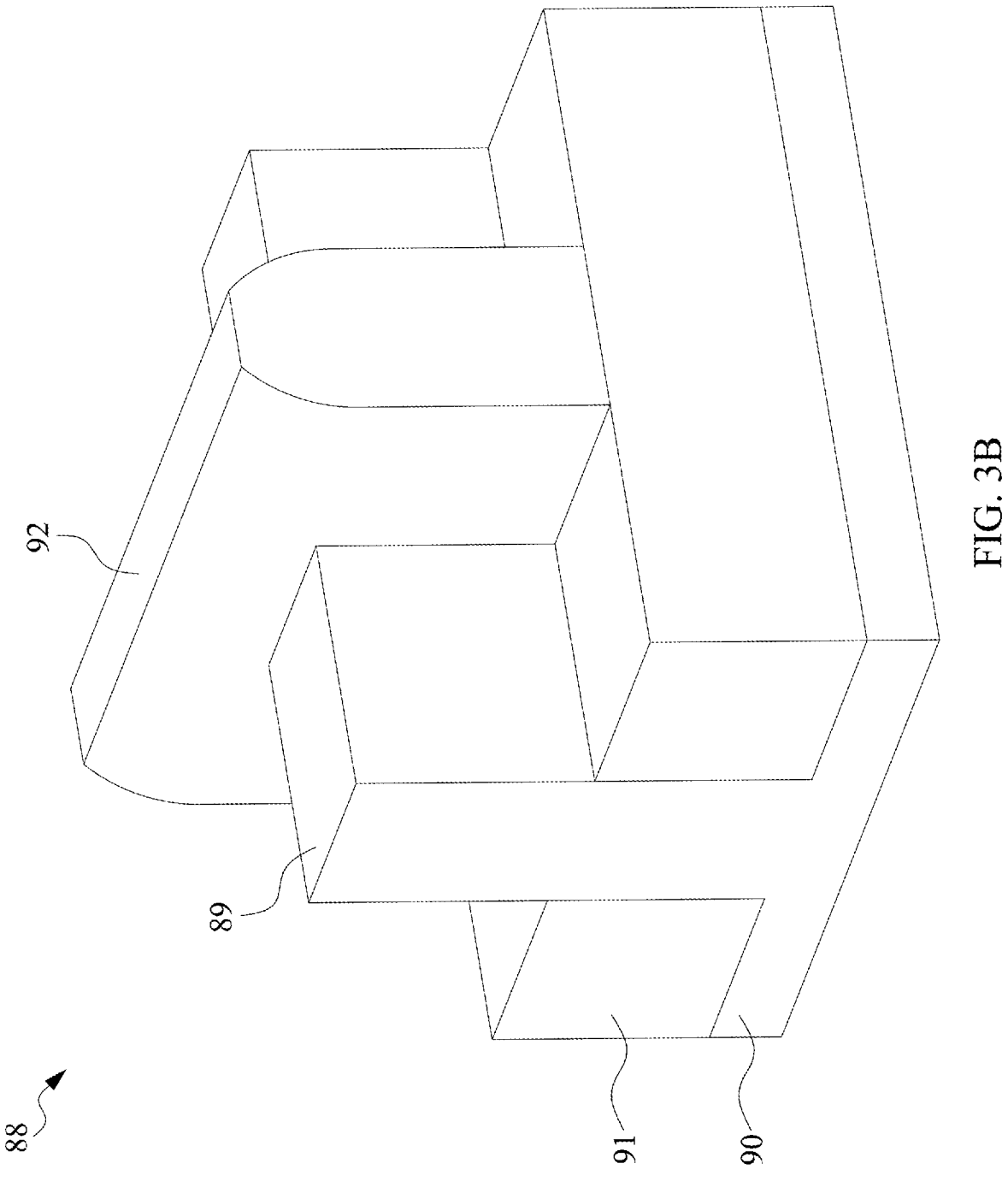
FIG. 3B is a diagram schematically illustrating a finfet cell that can be used in manufacturing the SRAM memory cell of FIG. 3A, in accordance with some embodiments.

FIG. 3B is a diagram schematically illustrating a finfet cell 88 that can be used in manufacturing the SRAM memory cell 46, in accordance with some embodiments. The finfet cell 88 includes a fin 89 extending from a substrate 90, such as a silicon substrate. The fin 89 includes a source region and a drain region, and a dielectric layer 91, such as an oxide layer, is situated on the substrate 90. A gate stack 92, including a gate dielectric layer, such as an oxide layer, covered by a gate conductive layer, such as a metal layer, is situated on three sides of the fin 89.

Figure 3C:
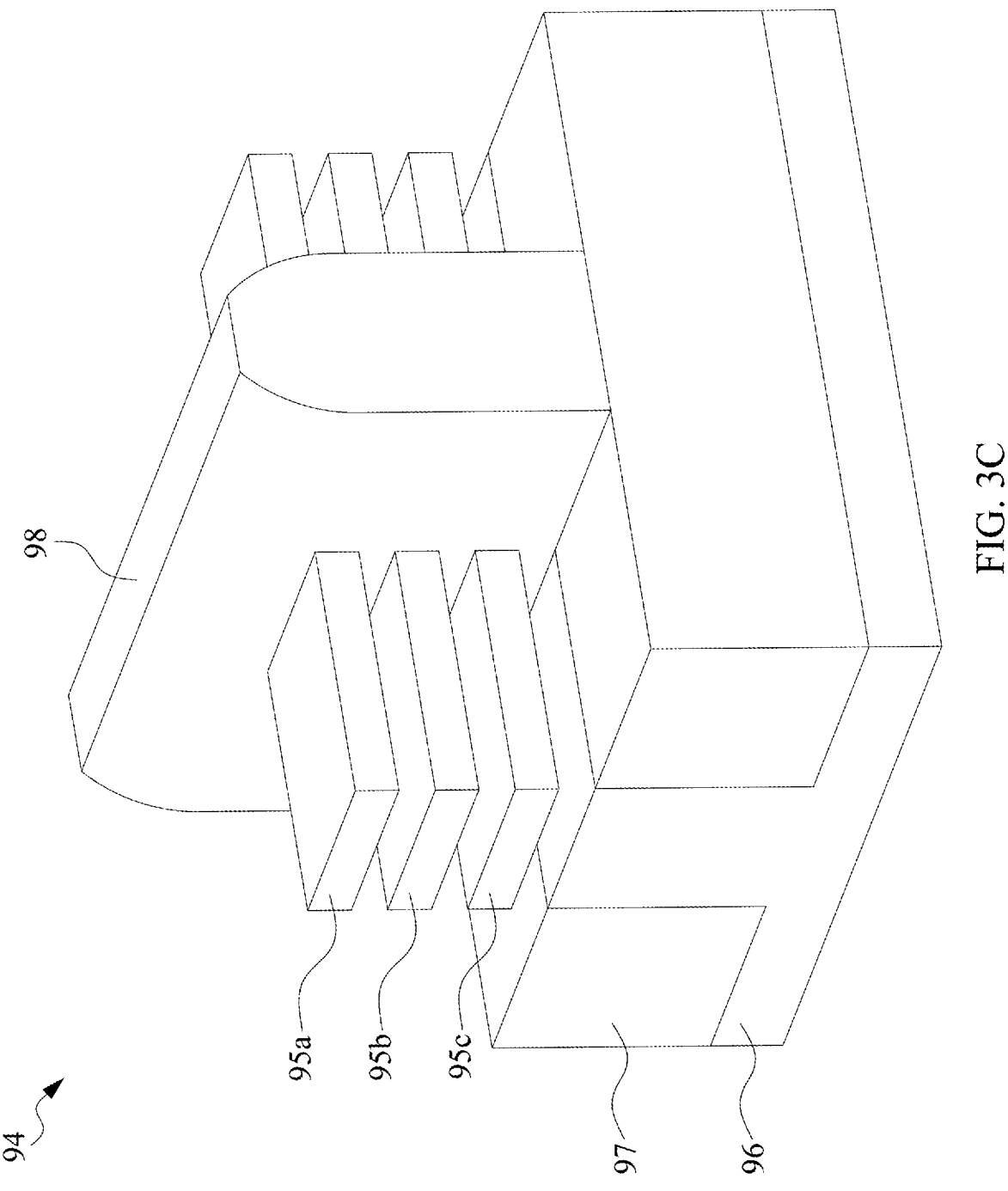
FIG. 3C is a diagram schematically illustrating a stacked nanosheet transistor that can be used in manufacturing the SRAM memory cell of FIG. 3A, in accordance with some embodiments.

FIG. 3C is a diagram schematically illustrating a stacked nanosheet transistor 94 that can be used in manufacturing the SRAM memory cell 46, in accordance with some embodiments. The stacked nanosheet transistor 94 is a type of field-effect transistor (fet) that includes a plurality of stacked nanosheets 95a-95c situated above a substrate 96, such as a silicon substrate. Each of the stacked nanosheets 95a-95c includes a source region and a drain region, and a dielectric layer 97, such as an oxide layer, is situated on the substrate 96. The nanosheet transistor 94 includes the stacked nanosheets 95a-95c in a gate-all-around (GAA) architecture, where each of the stacked nanosheets 95a-95c is separated by a gate stack 98 that includes a gate dielectric layer, such as an oxide layer, covered by a gate conductive layer, such as a metal layer. The gate stack 98 wraps around all sides of each of the stacked nanosheets 95a-95c, thereby forming the GAA structure.

The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical shape or a substantially rectangular cross-section.

Figure 4:
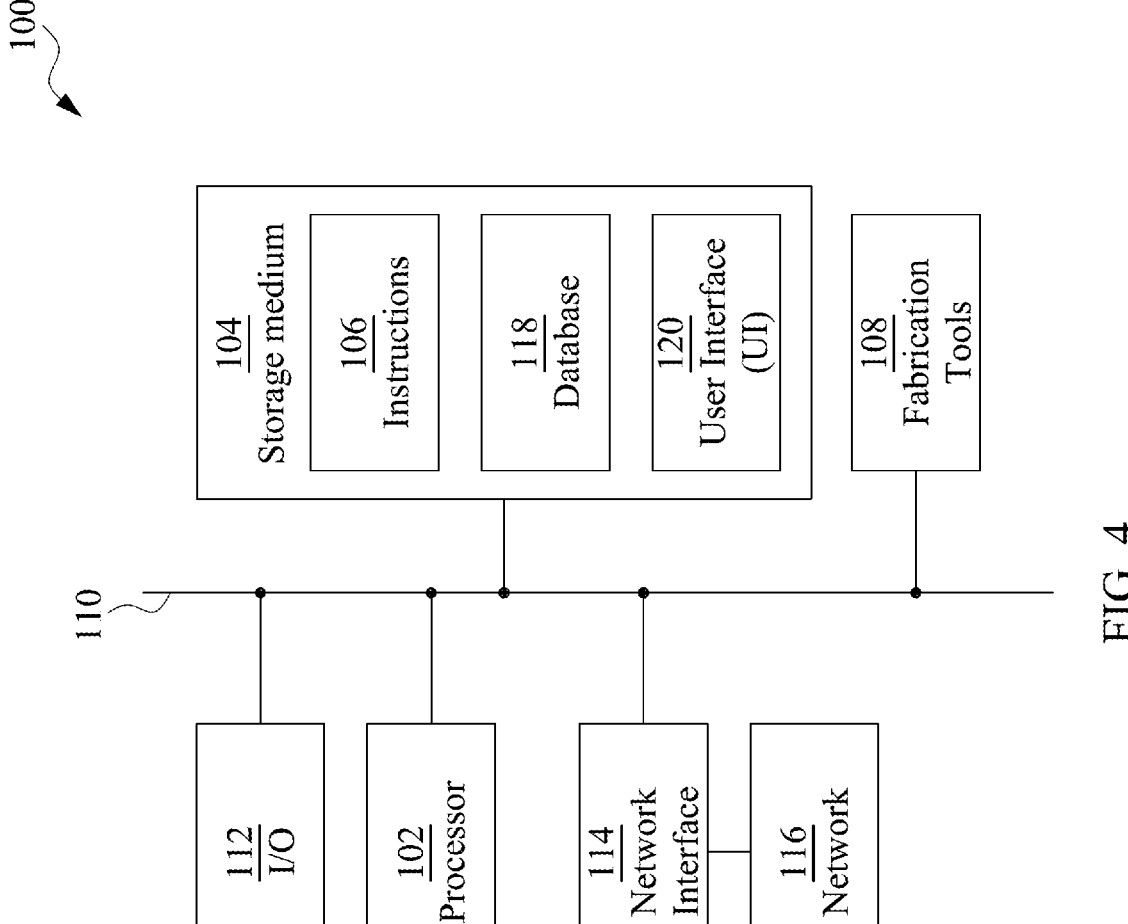
FIG. 4 is a block diagram schematically illustrating an example of a computer system configured for designing and manufacturing the SRAM-based FPGA devices of this disclosure, in accordance with some embodiments.

FIG. 4 is a block diagram schematically illustrating an example of a computer system 100 configured for designing and manufacturing the SRAM-based FPGA devices of this disclosure, including the SRAM-based FPGA device 20, in accordance with some embodiments. Some or all the design and manufacture of the integrated circuits (ICs) and devices of this disclosure can be performed by or with the computer system 100. In some embodiments, the computer system 100 includes an EDA system.

In some embodiments, the system 100 is a general-purpose computing device including a processor 102 and a non-transitory, computer-readable storage medium 104. The computer-readable storage medium 104 may be encoded with, e.g., store, computer program code such as executable instructions 106. Execution of the instructions 106 by the processor 102 provides (at least in part) a design tool that implements a portion or all the functions of the system 100, such as placement, layout, routing, pre-layout simulations, post-layout simulations, rerouting, and a final layout for manufacturing. Further, fabrication tools 108 are included to further layout and physically implement the design and manufacture of the ICs and the devices. In some embodiments, the system 100 includes a commercial router. In some embodiments, the system 100 can include an automated place and route (APR) system.

The processor 102 is electrically coupled to the computer-readable storage medium 104 by a bus 110 and to an I/O interface 112 by the bus 110. A network interface 114 is also electrically connected to the processor 102 by the bus 110. The network interface 114 is connected to a network 116, so that the processor 102 and the computer-readable storage medium 104 can connect to external elements using the network 116. The processor 102 is configured to execute the computer program code or instructions 106 encoded in the computer-readable storage medium 104 to cause the system 100 to perform a portion or all the functions of the system 100. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, magnetic, optical, electromagnetic, infrared, and/or semiconductor system or apparatus or device. For example, the computer-readable storage medium 104 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer-readable storage medium 104 can include a compact disk, read only memory (CD-ROM), a compact disk read/write memory (CD-R/W), and/or a digital video disc (DVD).

In some embodiments, the computer-readable storage medium 104 stores computer program code or instructions 106 configured to cause the system 100 to perform a portion or all the functions of the system 100. In some embodiments, the computer-readable storage medium 104 also stores information which facilitates performing a portion or all the functions of the system 100. In some embodiments, the computer-readable storage medium 104 stores a database 118 that includes one or more of component libraries, digital circuit cell libraries, and databases.

The EDA system 100 includes the I/O interface 112, which is coupled to external circuitry. In some embodiments, the I/O interface 112 includes a keyboard, keypad, mouse, trackball, trackpad, touchscreen, and/or cursor direction keys for communicating information and commands to the processor 102.

The network interface 114 is coupled to the processor 102 and allows the system 100 to communicate with the network 116, to which one or more other computer systems are connected. The network interface 114 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 100 can be performed in two or more systems that are like system 100.

The system 100 is configured to receive information through the I/O interface 112. The information received through the I/O interface 112 includes one or more of instructions, data, design rules, libraries of components and cells, and/or other parameters for processing by processor 102. The information is transferred to the processor 102 by the bus 110. Also, the EDA system 100 is configured to receive information related to a user interface (UI) through the I/O interface 112. This UI information can be stored in the computer-readable storage medium 104 as a UI 120.

In some embodiments, a portion or all the functions of the system 100 are implemented via a standalone software application for execution by a processor. In some embodiments, a portion or all the functions of the system 100 are implemented in a software application that is a part of an additional software application. In some embodiments, a portion or all the functions of the system 100 are implemented as a plug-in to a software application. In some embodiments, at least one of the functions of the system 100 is implemented as a software application that is a portion of an EDA tool. In some embodiments, a portion or all the functions of the system 100 are implemented as a software application that is used by the system 100. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a DVD, a magnetic disk such as a hard disk, a semiconductor memory such as a ROM and RAM, and a memory card, and the like.

As noted above, embodiments of the system 100 include fabrication tools 108 for implementing the manufacturing processes of the system 100. For example, based on the final layout, photolithographic masks may be generated, which are used to fabricate the ICs and devices by the fabrication tools 108.

Figure 5:
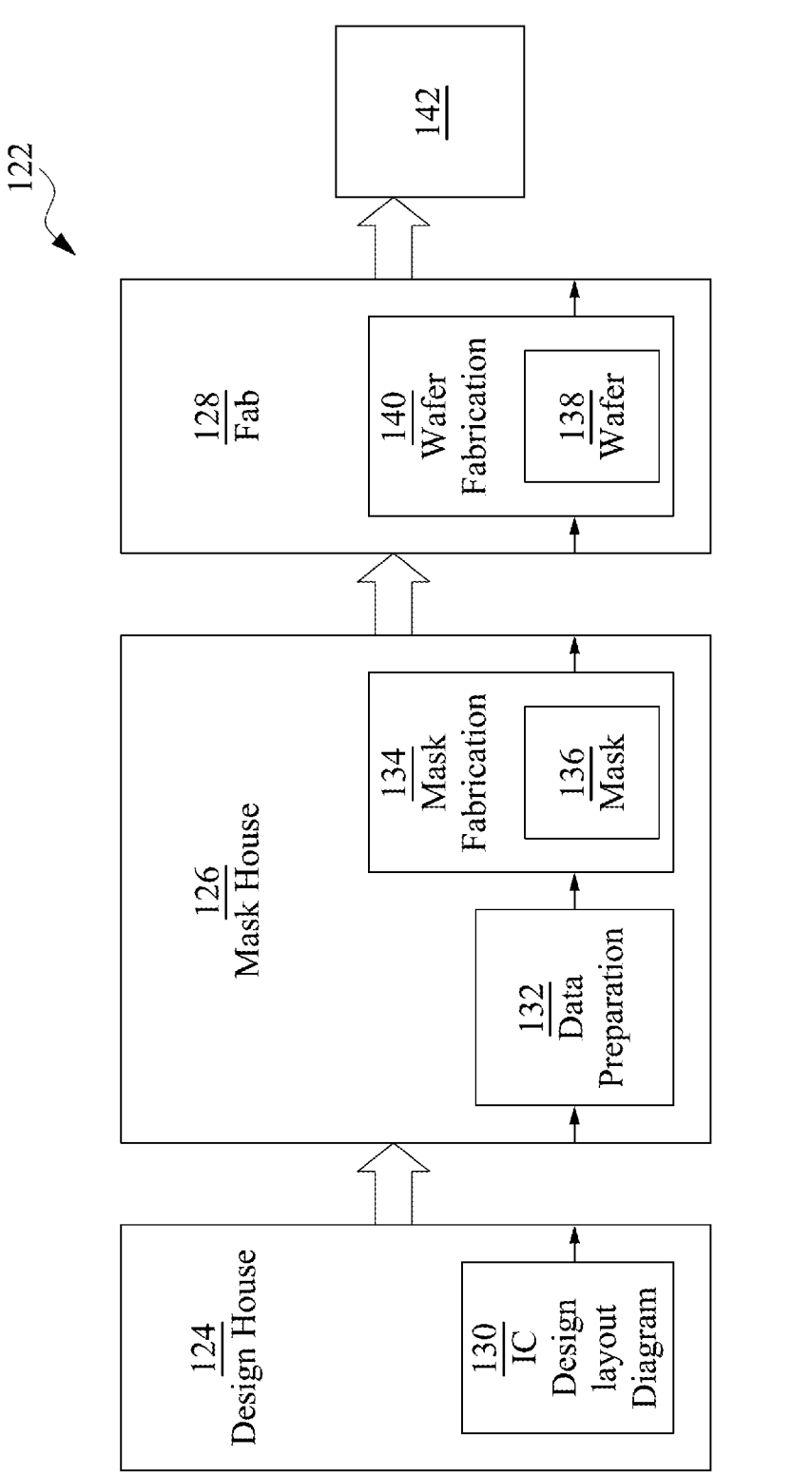
FIG. 5 is a block diagram of an IC manufacturing system and an IC manufacturing flow associated therewith, in accordance with some embodiments.

Further aspects of device fabrication are disclosed in conjunction with FIG. 5, which is a block diagram of an IC manufacturing system 122 and an IC manufacturing flow associated therewith, in accordance with some embodiments. In some embodiments, based on a layout diagram, one or more semiconductor masks and/or at least one component in a layer of a semiconductor IC is fabricated using the manufacturing system 122.

In FIG. 5, the IC manufacturing system 122 includes entities, such as a design house 124, a mask house 126, and an IC manufacturer/fabricator ("fab") 128, that interact with one another in the design, development, and manufacturing cycles and/or services related to manufacturing an IC, such as the ICs described herein. The entities in the system 122 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 124, the mask house 126, and the IC fab 128 are owned by a single larger company. In some embodiments, two or more of the design house 124, the mask house 126, and the IC fab 128 coexist in a common facility and use common resources.

The design house (or design team) 124 generates an IC design layout diagram 130. The IC design layout diagram 130 includes various geometrical patterns, or IC layout diagrams designed for an IC device. The geometrical patterns correspond to patterns of metal, oxide, or semiconductor layers that make up the various components of the semiconductor structures to be fabricated. The various layers combine to form various IC features. For example, a portion of the IC design layout diagram 130 includes various IC features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 124 implements a design procedure to form an IC design layout diagram 130. The IC design layout diagram 130 is presented in one or more data files having information of the geometrical patterns. For example, IC design layout diagram 130 can be expressed in a GDSII file format or DFII file format. In some embodiments, the design procedure includes one or more of analog circuit design, digital logic circuit design, place and route routines, and physical layout designs.

The mask house 126 includes data preparation 132 and mask fabrication 134. The mask house 126 uses the IC design layout diagram 130 to manufacture one or more masks 136 to be used for fabricating the various layers of the IC or semiconductor structure. The mask house 126 performs mask data preparation 132, where the IC design layout diagram 130 is translated into a representative data file (RDF). The mask data preparation 132 provides the RDF to the mask fabrication 134. The mask fabrication 134 includes a mask writer that converts the RDF to an image on a substrate, such as a mask (reticle) 136 or a semiconductor wafer 138. The design layout diagram 130 is manipulated by the mask data preparation 132 to comply with characteristics of the mask writer and/or criteria of the IC fab 128. In FIG. 5, the mask data preparation 132 and the mask fabrication 134 are illustrated as separate elements. In some embodiments, the mask data preparation 132 and the mask fabrication 134 can be collectively referred to as mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the IC design layout diagram 130. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the IC design layout diagram 130 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 130 to compensate for limitations during the mask fabrication 134, which may undo part of the modifications performed by OPC to meet mask creation rules.

In some embodiments, the mask data preparation 132 includes lithography process checking (LPC) that simulates processing that will be implemented by the IC fab 128. LPC simulates this processing based on the IC design layout diagram 130 to create a simulated manufactured device. The processing parameters in LPC simulation can include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 130.

The above description of mask data preparation 132 has been simplified for the purposes of clarity. In some embodiments, data preparation 132 includes additional features such as a logic operation (LOP) to modify the IC design layout diagram 130 according to manufacturing rules. Additionally, the processes applied to the IC design layout diagram 130 during data preparation 132 may be executed in a variety of different orders.

After the mask data preparation 132 and during the mask fabrication 134, a mask 136 or a group of masks 136 are fabricated based on the modified IC design layout diagram 130. In some embodiments, the mask fabrication 134 includes performing one or more lithographic exposures based on the IC design layout diagram 130. In some embodiments, an electron-beam (e-beam) or a mechanism of multiple e-beams is used to form a pattern on a mask (photomask or reticle) 136 based on the modified IC design layout diagram 130. The mask 136 can be formed in various technologies. In some embodiments, the mask 136 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 136 includes a transparent substrate (e.g., fused quartz) and an opaque material (e.g., chromium) coated in the opaque regions of the binary mask. In another example, the mask 136 is formed using a phase shift technology. In a phase shift mask (PSM) version of the mask 136, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 134 is used in a variety of processes. For example, such a mask(s) is used in an ion implantation process to form various doped regions in the semiconductor wafer 138, in an etching process to form various etching regions in the semiconductor wafer 138, and/or in other suitable processes.

In some embodiments, EUV lithography is used to pattern the FEOL/MEOL/BEOL layers. In some embodiments, the SRAM-based FPGA and the configuration device designed and manufactured in accordance with the logic rules and technology includes one of finfets and stacked nanosheet transistors. In some embodiments, EUV lithography is used to manufacture the finfets and the stacked nanosheet transistors.

The IC fab 128 includes wafer fabrication 140. The IC fab 128 is an IC fabrication business that includes one or more manufacturing facilities for the fabrication of a variety of different IC products. In some embodiments, the IC fab 128 is a semiconductor foundry. For example, there may be a manufacturing facility for the FEOL fabrication of a plurality of IC products, a second manufacturing facility may provide the MEOL fabrication, and a third manufacturing facility may provide the BEOL fabrication for the interconnection and packaging of the IC products, and a fourth manufacturing facility may provide other services for the foundry business.

The IC fab 128 uses the mask(s) 136 fabricated by the mask house 126 to fabricate the semiconductor structures or ICs 142 of the current disclosure. Thus, the IC fab 128 at least indirectly uses the IC design layout diagram 130 to fabricate the semiconductor structures or ICs 142 of the current disclosure. Also, the semiconductor wafer 138 includes a silicon substrate or other proper substrate having material layers formed thereon, and the semiconductor wafer 138 further includes one or more of various doped regions, dielectric features, multilevel interconnects, and the like (formed at subsequent manufacturing steps). In some embodiments, the semiconductor wafer 138 is fabricated by the IC fab 128 using the mask(s) 136 to form the semiconductor structures or ICs 142 of the current disclosure. In some embodiments, the IC fabrication includes performing one or more lithographic exposures based at least indirectly on the IC design layout diagram 130.

As described above, disclosed embodiments include 6T SRAM circuits designed and manufactured in accordance with the logic rules and technology. Each of the 6T SRAM circuit layouts includes MEOL vias to BEOL conductive layers to provide conductive paths in the circuit that are RC balanced to reduce mismatch and provide better circuit operation margins. Also, the 6T SRAM circuit layouts include conductive tracks that align with power and reference lines to provide more robust connections to the power and reference lines and, in some embodiments, the 6T SRAM circuit layouts are directly connected, without jumpers, to other logic devices which improves PPA.

Figure 6:
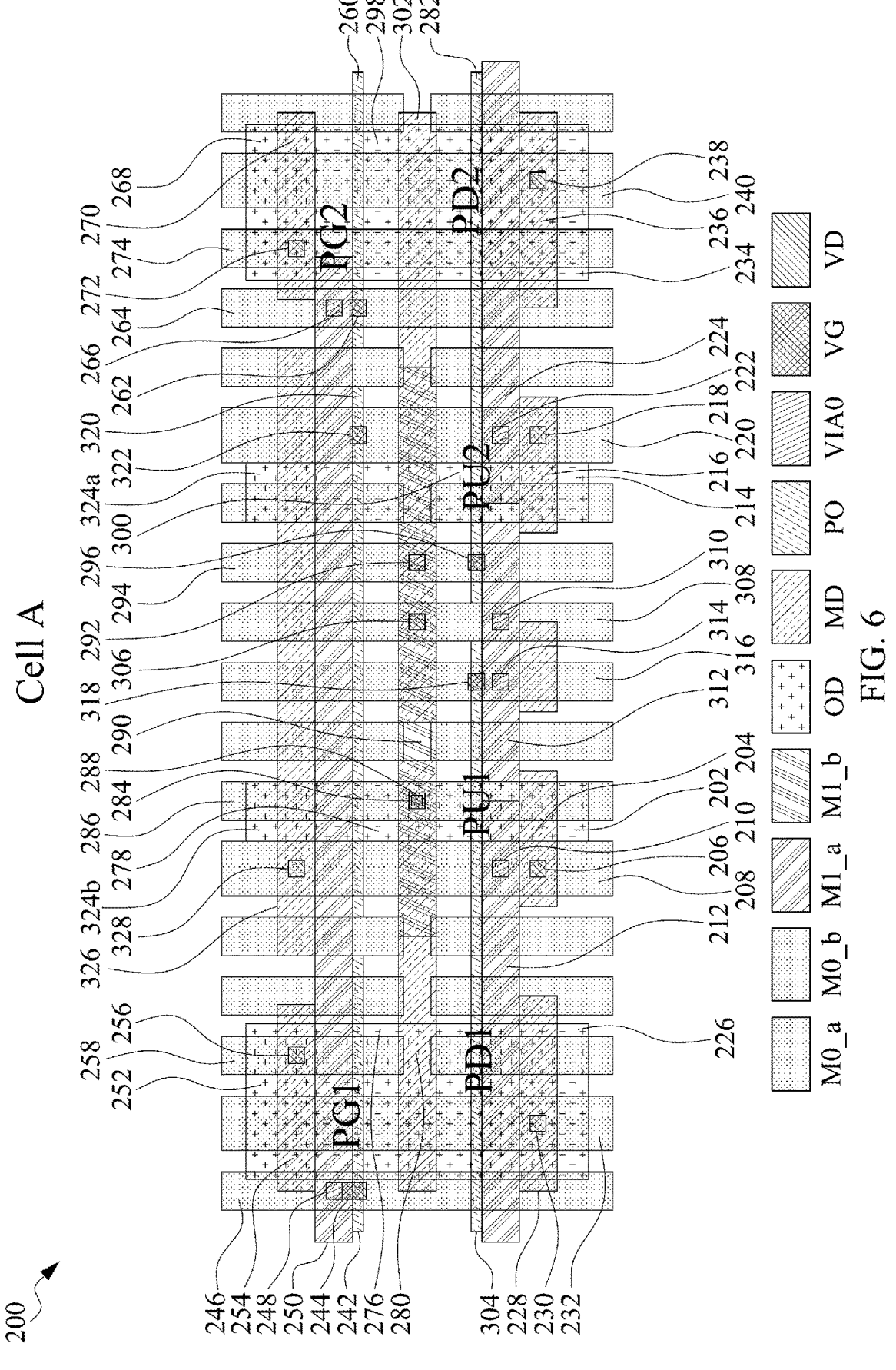
FIG. 6 is a diagram schematically illustrating a 6T SRAM circuit layout, referred to herein as cell A, in accordance with some embodiments.

FIG. 6 is a diagram schematically illustrating a 6T SRAM circuit layout 200, also referred to herein as cell A, in accordance with some embodiments. The circuit layout 200 is designed in accordance with the logic rules and technology, and not the SRAM rules and technology.

The circuit layout 200 is a layout of the 6T SRAM memory cell 46 of FIG. 3A. In other embodiments, the circuit layout 200 can be a layout of a different SRAM memory cell. In some embodiments, the circuit layout 200 can include more than six transistors. In some embodiments, the circuit layout 200 can include fewer than six transistors. In some embodiments, the circuit layout 200 can be a layout of one of a 4T, an 8T, or a 10T SRAM memory cell.

The circuit layout 200 includes the four NMOS transistors PD1, PD2, PG1, and PG2 and the two PMOS transistors PU1 and PU2 of the 6T SRAM memory cell 46. The PMOS transistor PU1 and the NMOS transistor PD1 form the first inverter, the PMOS transistor PU2 and the NMOS transistor PD2 form the second inverter, and the NMOS transistors PG1 and PG2 are the two pass gates.

The first and second inverters are cross coupled to each other to form the latch circuit for data storage. A first drain/source terminal 202 of transistor PU1 is configured to be coupled to the power supply voltage VDD through an MD layer track 204 to a VD via 206 to an M0 layer track 208 to a VIA0 via 210 and to a M1 layer track 212. A first drain/source terminal 214 of transistor PU2 is configured to be coupled to the power supply voltage VDD through an MD layer track 216 to a VD via 218 to an M0 layer track 220 to a VIA0 via 222 and to the M1 layer track 224. In each of these the M0 layer track is one of M0_a and M0_b and the M1 layer track is one of M1_a and M1_b. The M0_a and M0_b layer tracks are part of a double patterning process for metal layer M0, and the M1_a and M1_b layer tracks are part of a double patterning process for metal layer M1.

Also, a first drain/source terminal 226 of transistor PD1 is configured to be coupled to the reference voltage VSS through an MD layer track 228 to a VD via 230 and to an M0 layer track 232, and a first drain/source terminal 234 of transistor PD2 is configured to be coupled to the reference voltage VSS through an MD layer track 236 to a VD via 238 and to an M0 layer track 240. In each of these the M0 layer track is one of M0_a and M0_b.

The gate terminal 242 of the first pass gate transistor PG1 is configured to be coupled to the word line WL through a gate via VD 244 to an M0 layer track 246 to a VIA0 via 248 and to a M1 layer track 250, and a first drain/source terminal 252 of the first pass gate transistor PG1 is configured to be coupled to the bit line BL through an MD layer track 254 to a VD via 256 and to an M0 layer track 258. In these the M0 layer track is one of M0_a and M0_b and the M1 layer track is one of M1_a and M1_b.

The gate terminal 260 of the second pass gate transistor PG2 is configured to be coupled to the word line WL through a gate via VD 262 to an M0 layer track 264 to a VIA0 via 266 and to the M1 layer track 250, and a first drain/source terminal 268 of the second pass gate transistor PG2 is configured to be coupled to the bit line bar BLB through an MD layer track 270 to a VD via 272 and to an M0 layer track 274. In these the M0 layer track is one of M0_a and M0_b and the M1 layer track is one of M1_a and M1_b.

In cross-coupling the first and second inverters, a second drain/source terminal 276 of the first pass gate transistor PG1 is shared by or coupled to the second drain/source terminal 276 of transistor PD1 and to a second drain/source terminal 278 of transistor PU1 through MD layer track 280. The MD layer track 280 is further coupled to gate terminal 282 of transistors PU2 and PD2 at node Q through a VD via 284 to an M0 layer track 286 to a VIA0 via 288 to an M1 layer track 290 to a VIA0 via 292 to an M0 layer track 294 to a gate via VG 296 and to the gate terminal 282. In this the M0 layer track is one of M0_a and M0_b and the M1 layer track is one of M1_a and M1_b.

Also, a second drain/source terminal 298 of the second pass gate transistor PG2 is shared by or coupled to the second drain/source terminal 298 of transistor PD2 and to a second drain/source terminal 300 of transistor PU2 through MD layer track 302. The MD layer track 302 is further coupled to gate terminal 304 of transistors PU1 and PD1 at node QB through a VD via 306 to an M0 layer track 308 to a VIA0 via 310 to an M1 layer track 312 to a VIA0 via 314 to an M0 layer track 316 to a gate via VG 318 and to the gate terminal 304. In this the M0 layer track is one of M0_a and M0_b and the M1 layer track is one of M1_a and M1_b.

The circuit layout 200 further includes two dummy PMOS transistors having a dummy gate 320 configured to be coupled to the power voltage VDD through gate via 322 to M0 layer track 220, and drain/source regions 324a and 324b configured to be coupled to the power voltage VDD through MD layer track 326 to VD via 328 to M0 layer track 208.

Figure 7:
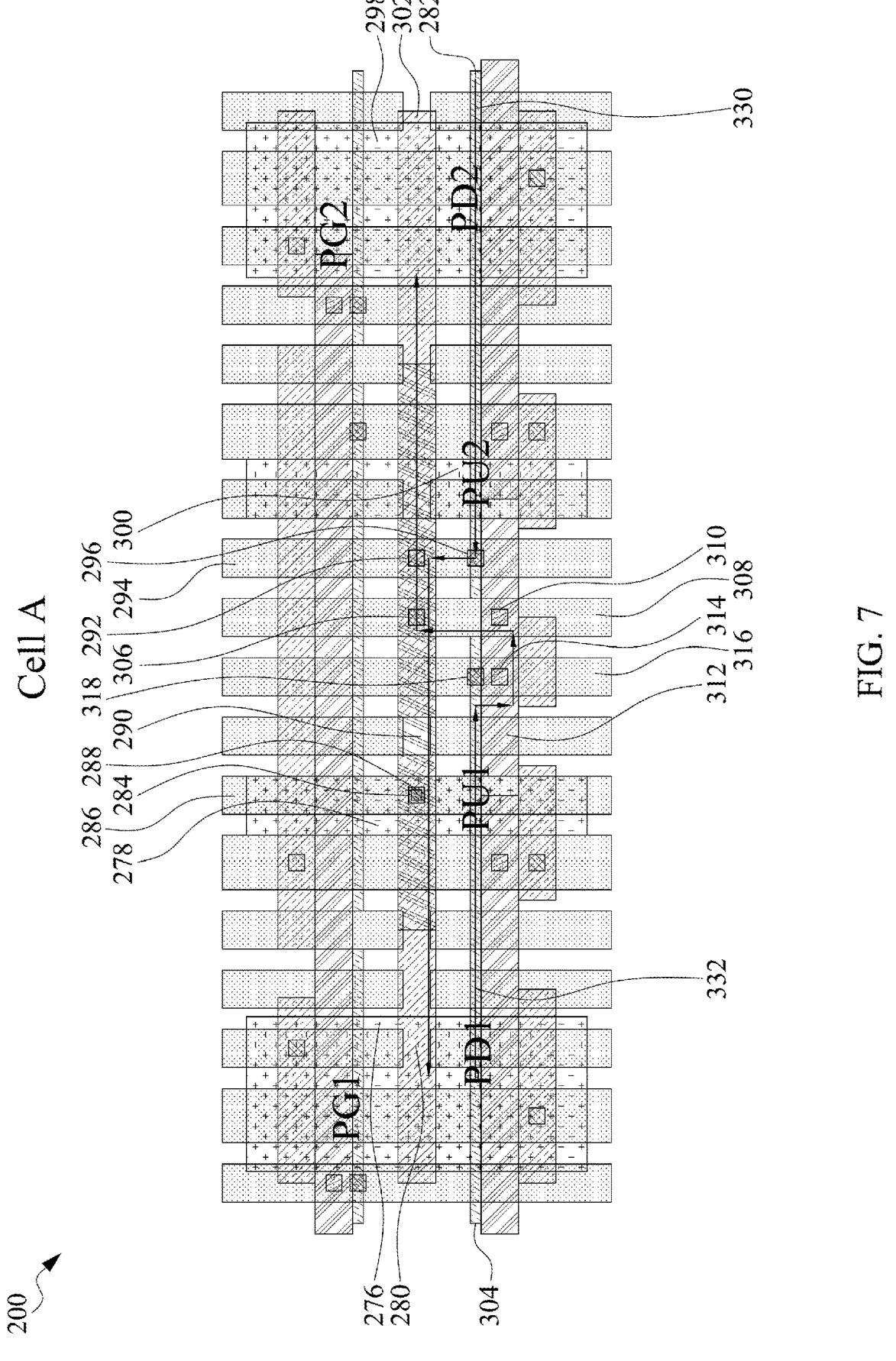
FIG. 7 is a diagram schematically illustrating two conductive paths that cross-couple the first and second inverters in the 6T SRAM circuit layout (cell A) of the 6T SRAM memory cell, in accordance with some embodiments.

FIG. 7 is a diagram schematically illustrating the two conductive paths 330 and 332 that cross-couple the first and second inverters in the 6T SRAM circuit layout 200 (cell A) of the 6T SRAM memory cell 46, in accordance with some embodiments. Each of the conductive paths 330 and 332 includes MEOL vias to BEOL conductive layers to provide conductive paths 330 and 332 that are balanced to have the same or close to the same RC characteristics. The balanced conductive paths 330 and 332 reduce cross-coupling mismatch and provide better circuit operation margins.

The first conductive path 330 extends between the gate terminal 282 of transistors PU2 and PD2 to the second drain/source terminal 278 of transistor PU1 and the second drain/source terminal 276 of the first pass gate transistor PG1 and the transistor PD1 at node Q. The first conductive path 330 passes from the gate terminal 282 through the gate via VG 296 to the M0 layer track 294 to the VIA0 via 292 to the M1 layer track 290 to the VIA0 via 288 to the M0 layer track 286 to the VD via 284 to the MD layer track 280 that extends over the second drain/source terminal 278 of transistor PU1 and the second drain/source terminal 276 of the first pass gate transistor PG1 and the transistor PD1 at node Q.

The second conductive path 332 extends between the gate terminal 304 of transistors PU1 and PD1 to the second drain/source terminal 300 of transistor PU2 and the second drain/source terminal 298 of the second pass gate transistor PG2 and the transistor PD2 at node QB. The second conductive path 332 passes from the gate terminal 304 through the gate via VG 318 to the M0 layer track 316 to the VIA0 via 314 to the M1 layer track 312 to the VIA0 via 310 to the M0 layer track 308 to the VD via 306 to the MD layer track 302 that extends over the second drain/source terminal 300 of transistor PU2 and the second drain/source terminal 298 of the second pass gate transistor PG2 and the transistor PD2 at node QB.

Figure 8:
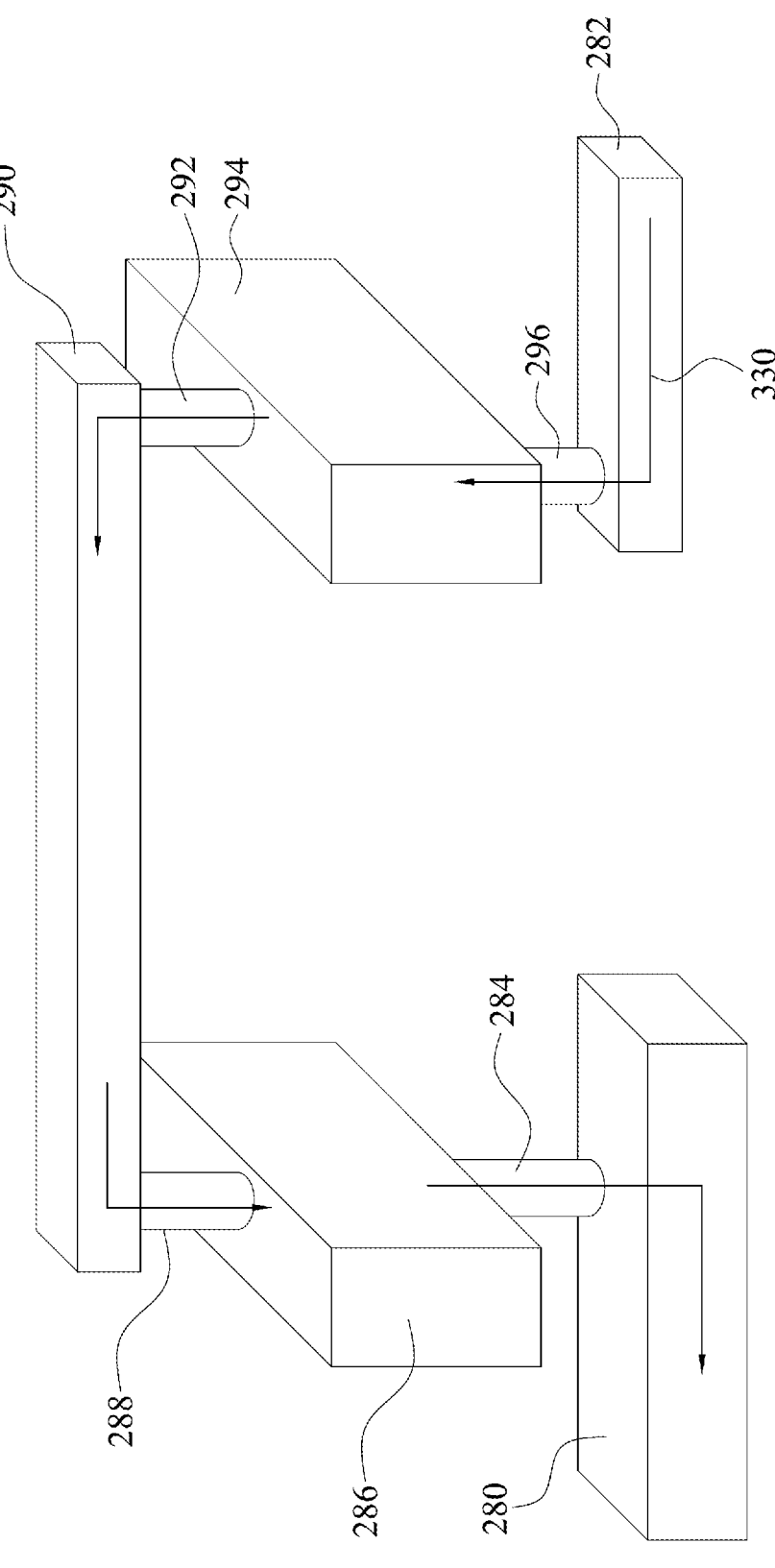
FIG. 8 is a diagram schematically illustrating a perspective cross-sectional view of the connections through the MEOL vias and the BEOL conductive layers in the first conductive path, in accordance with some embodiments.

FIG. 8 is a diagram schematically illustrating a perspective cross-sectional view of the connections through the MEOL vias and the BEOL conductive layers in the first conductive path 330, in accordance with some embodiments.

As described above, the first conductive path 330 extends between the poly gate terminal 282 of transistors PU2 and PD2 to the second drain/source terminal 278 of transistor PU1 and the second drain/source terminal 276 of the first pass gate transistor PG1 and the transistor PD1 at node Q. The first conductive path 330 passes from the poly gate terminal 282 through the gate via VG 296 to the M0 layer track 294 to the VIA0 via 292 to the M1 layer track 290 to the VIA0 via 288 to the M0 layer track 286 to the VD via 284 to the MD layer track 280 that extends over the second drain/source terminal 278 of transistor PU1 and the second drain/source terminal 276 of the first pass gate transistor PG1 and the transistor PD1 at node Q.

The connections through the MEOL vias and the BEOL conductive layers in the second conductive path 332 are the same as these connections illustrated in FIG. 8, such that the connections through the MEOL vias and the BEOL conductive layers in the second conductive path 332 will not be separately illustrated.

The conductive paths 330 and 332 have similar pathways that include MEOL vias to BEOL conductive layers such that the conductive paths 330 and 332 are matched, i.e., balanced, to have the same or close to the same RC characteristics. As a result, the conductive paths 330 and 332 produce similar timing results, reduce cross-coupling mismatch, and provide better circuit operation margins.

Figure 9:
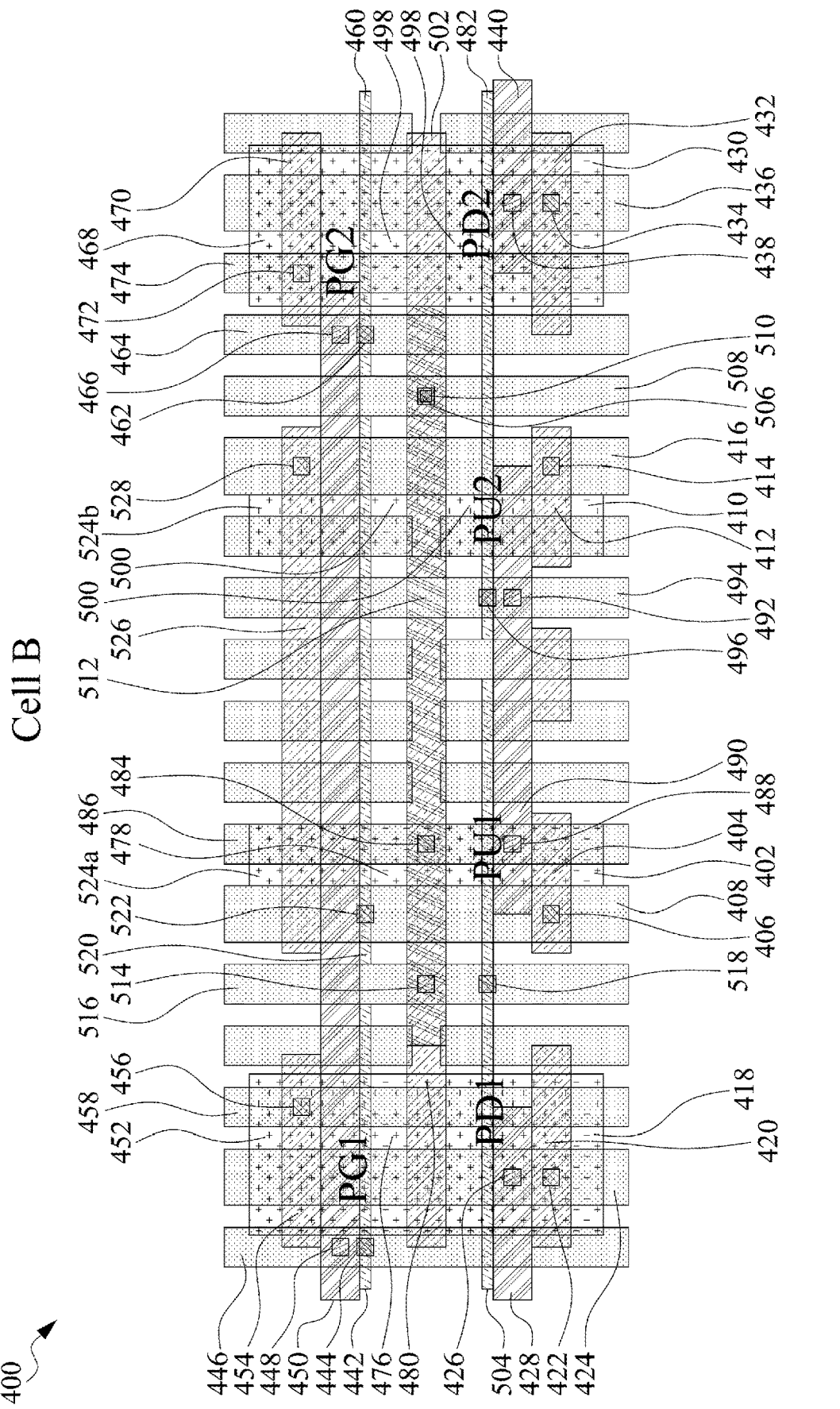
FIG. 9 is a diagram schematically illustrating another 6T SRAM circuit layout, referred to herein as cell B, in accordance with some embodiments.

FIG. 9 is a diagram schematically illustrating another 6T SRAM circuit layout 400, referred to herein as cell B, in accordance with some embodiments. The circuit layout 400 is designed in accordance with the logic rules and technology, and not the SRAM rules and technology.

The circuit layout 400 is a layout of the 6T SRAM memory cell 46 of FIG. 3A. In other embodiments, the circuit layout 400 can be a layout of a different SRAM memory cell. In some embodiments, the circuit layout 400 can include more than six transistors. In some embodiments, the circuit layout 400 can include fewer than six transistors. In some embodiments, the circuit layout 400 can be a layout of one of a 4T, an 8T, or a 10T SRAM memory cell.

The circuit layout 400 includes the four NMOS transistors PD1, PD2, PG1, and PG2 and the two PMOS transistors PU1 and PU2 of the 6T SRAM memory cell 46. The PMOS transistor PU1 and the NMOS transistor PD1 form the first inverter, the PMOS transistor PU2 and the NMOS transistor PD2 form the second inverter, and the NMOS transistors PG1 and PG2 are the two pass gates.

The first and second inverters are cross coupled to each other to form the latch circuit for data storage. A first drain/source terminal 402 of transistor PU1 is configured to be coupled to the power supply voltage VDD through an MD layer track 404 to a VD via 406 to an M0 layer track 408. A first drain/source terminal 410 of transistor PU2 is configured to be coupled to the power supply voltage VDD through an MD layer track 412 to a VD via 414 to an M0 layer track 416. In each of these the M0 layer track is one of M0_a and M0_b.

Also, a first drain/source terminal 418 of transistor PD1 is configured to be coupled to the reference voltage VSS through an MD layer track 420 to a VD via 422 to an M0 layer track 424 to a VIA0 via 426 and to a M1 layer track 428, and a first drain/source terminal 430 of transistor PD2 is configured to be coupled to the reference voltage VSS through an MD layer track 432 to a VD via 434 to an M0 layer track 436 to a VIA0 via 438 and to a M1 layer track 440. In each of these the M0 layer track is one of M0_a and M0_b and the M1 layer track is one of M1_a and M1_b.

The gate terminal 442 of the first pass gate transistor PG1 is configured to be coupled to the word line WL through a gate via VG 444 to an M0 layer track 446 to a VIA0 via 448 and to a M1 layer track 450, and a first drain/source terminal 452 of the first pass gate transistor PG1 is configured to be coupled to the bit line BL through an MD layer track 454 to a VD via 456 and to an M0 layer track 458. In each of these the M0 layer track is one of M0_a and M0_b and the M1 layer track is one of M1_a and M1_b.

The gate terminal 460 of the second pass gate transistor PG2 is configured to be coupled to the word line WL through a gate via VG 462 to an M0 layer track 464 to a VIA0 via 466 and to the M1 layer track 450, and a first drain/source terminal 468 of the second pass gate transistor PG2 is configured to be coupled to the bit line bar BLB through an MD layer track 470 to a VD via 472 and to an M0 layer track 474. In each of these the M0 layer track is one of M0_a and M0_b and the M1 layer track is one of M1_a and M1_b.

In cross-coupling the first and second inverters, a second drain/source terminal 476 of the first pass gate transistor PG1 is shared by or coupled to the second drain/source terminal 476 of transistor PD1 and to a second drain/source terminal 478 of transistor PU1 through MD layer track 480. The MD layer track 480 is further coupled to gate terminal 482 of transistors PU2 and PD2 at node Q through a VD via 484 to an M0 layer track 486 to a VIA0 via 488 to an M1 layer track 490 to a VIA0 via 492 to an M0 layer track 494 to a gate via VG 496 and to the gate terminal 482. In this the M0 layer track is one of M0_a and M0_b and the M1 layer track is one of M1_a and M1_b.

Also, a second drain/source terminal 498 of the second pass gate transistor PG2 is shared by or coupled to the second drain/source terminal 498 of transistor PD2 and to a second drain/source terminal 500 of transistor PU2 through MD layer track 502. The MD layer track 502 is further coupled to gate terminal 504 of transistors PU1 and PD1 at node QB through a VD via 506 to an M0 layer track 508 to a VIA0 via 510 to an M1 layer track 512 to a VIA0 via 514 to an M0 layer track 516 to a gate via VG 518 and to the gate terminal 504. In this the M0 layer track is one of M0_a and M0_b and the M1 layer track is one of M1_a and M1_b.

The circuit layout 400 further includes two dummy PMOS transistors having a dummy gate 520 configured to be coupled to the power voltage VDD through gate via 522 to M0 layer track 408, and drain/source regions 524a and 524*b* configured to be coupled to the power voltage VDD through MD layer track 526 to VD via 528 to M0 layer track 416.

Figure 10:
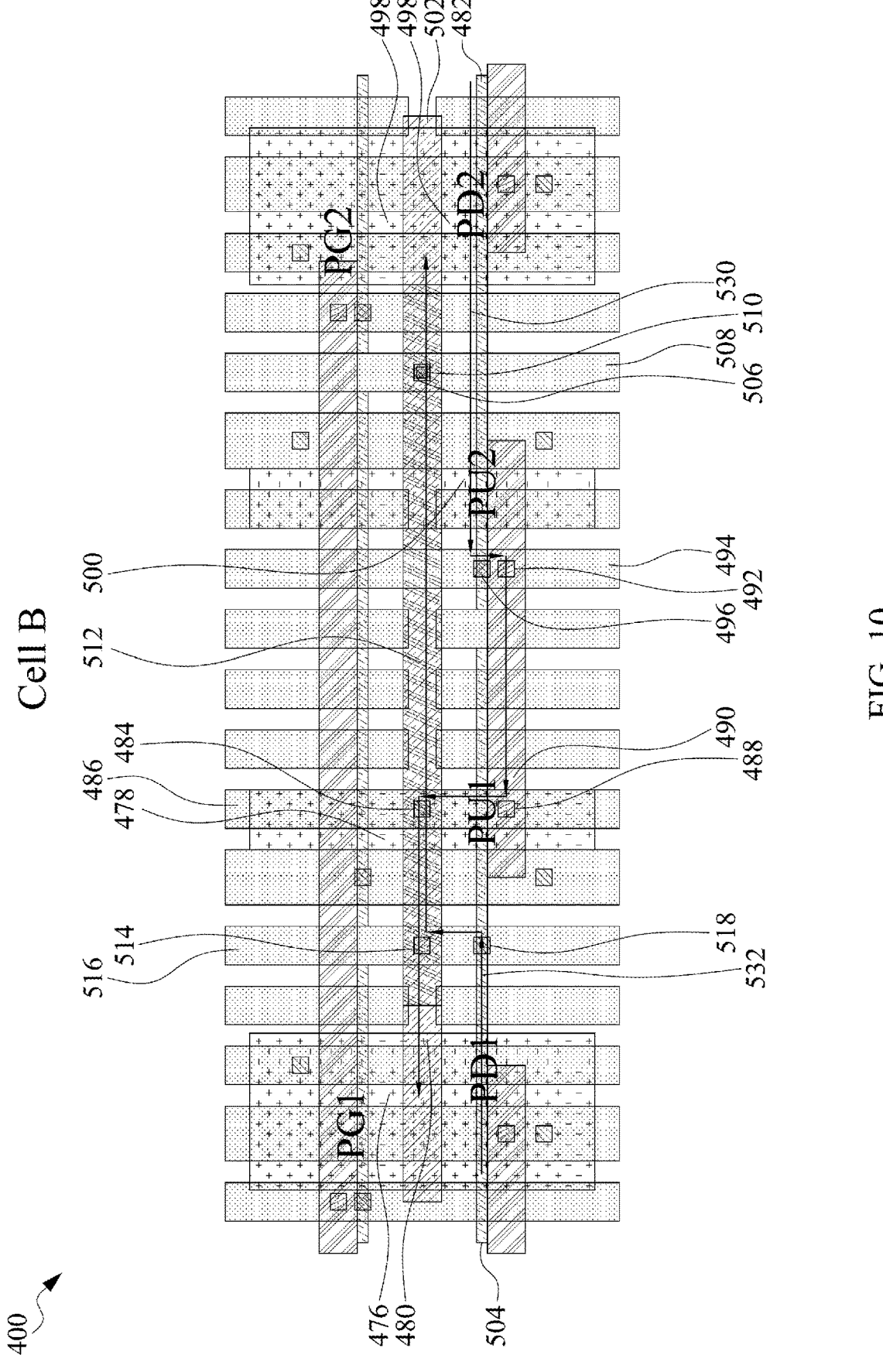
FIG. 10 is a diagram schematically illustrating two conductive paths that cross-couple the first and second inverters in the 6T SRAM circuit layout (cell B) of the 6T SRAM memory cell, in accordance with some embodiments.

FIG. 10 is a diagram schematically illustrating the two conductive paths 530 and 532 that cross-couple the first and second inverters in the 6T SRAM circuit layout 400 (cell B) of the 6T SRAM memory cell 46, in accordance with some embodiments. Each of the conductive paths 530 and 532 includes MEOL vias to BEOL conductive layers to provide conductive paths 530 and 532 that are balanced to have the same or close to the same RC characteristics. The balanced conductive paths 530 and 532 reduce cross-coupling mismatch and provide better circuit operation margins.

The first conductive path 530 extends between the gate terminal 482 of transistors PU2 and PD2 to the second drain/source terminal 478 of transistor PU1 and the second drain/source terminal 476 of the first pass gate transistor PG1 and the transistor PD1 at node Q. The first conductive path 530 passes from the gate terminal 482 through the gate via VG 496 to the M0 layer track 494 to the VIA0 via 492 to the M1 layer track 490 to the VIA0 via 488 to the M0 layer track 486 to the VD via 484 to the MD layer track 480 that extends over the second drain/source terminal 478 of transistor PU1 and the second drain/source terminal 476 of the first pass gate transistor PG1 and the transistor PD1 at node Q.

The second conductive path 532 extends between the gate terminal 504 of transistors PU1 and PD1 to the second drain/source terminal 500 of transistor PU2 and the second drain/source terminal 498 of the second pass gate transistor PG2 and the transistor PD2 at node QB. The second conductive path 532 passes from the gate terminal 504 through the gate via VG 518 to the M0 layer track 516 to the VIA0 via 514 to the M1 layer track 512 to the VIA0 via 510 to the M0 layer track 508 to the VD via 506 to the MD layer track 502 that extends over the second drain/source terminal 500 of transistor PU2 and the second drain/source terminal 498 of the second pass gate transistor PG2 and the transistor PD2 at node QB.

Each of the conductive paths 530 and 532 includes connections through MEOL vias and BEOL conductive layers. The connections through the MEOL vias and the BEOL conductive layers in the first and second conductive paths 530 and 532 are like the connections illustrated in FIG. 8, such that the connections through the MEOL vias and the BEOL conductive layers in the first and second conductive paths 530 and 532 will not be separately illustrated.

The conductive paths 530 and 532 have similar pathways that include MEOL vias to BEOL conductive layers such that the conductive paths 530 and 532 are matched, i.e., balanced, to have the same or close to the same RC characteristics. As a result, the conductive paths 530 and 532 produce similar timing results, reduce cross-coupling mismatch, and provide better circuit operation margins.

An SRAM-based FPGA 24 including the 6T SRAM circuit layout 200 (cell A) or the 6T SRAM circuit layout 400 (cell B) designed and manufactured with the logic rules and technology is more easily integrated with the configuration device and with other peripheral logic devices. In some embodiments, the SRAM-based FPGA 24 including the 6T SRAM circuit layout 200 (cell A) or the 6T SRAM circuit layout 400 (cell B) designed and manufactured in accordance with the logic rules and technology provides more robust power line and reference line connections. Also, the SRAM-based FPGA 24 including the 6T SRAM circuit layout 200 (cell A) or the 6T SRAM circuit layout 400 (cell B) benefits from FEOL, MEOL, and BEOL simple abutment with neighboring logic devices, such that the SRAM-based FPGA 24 and the configuration device 22 can be situated directly adjacent each other and the neighboring logic devices. Also, each of the 6T SRAM circuit layout 200 (cell A) and the 6T SRAM circuit layout 400 (cell B) includes conductive tracks, such as M0 layer tracks, that align with the power lines, reference lines, and bit lines to provide simple and robust connections.

Figure 11:
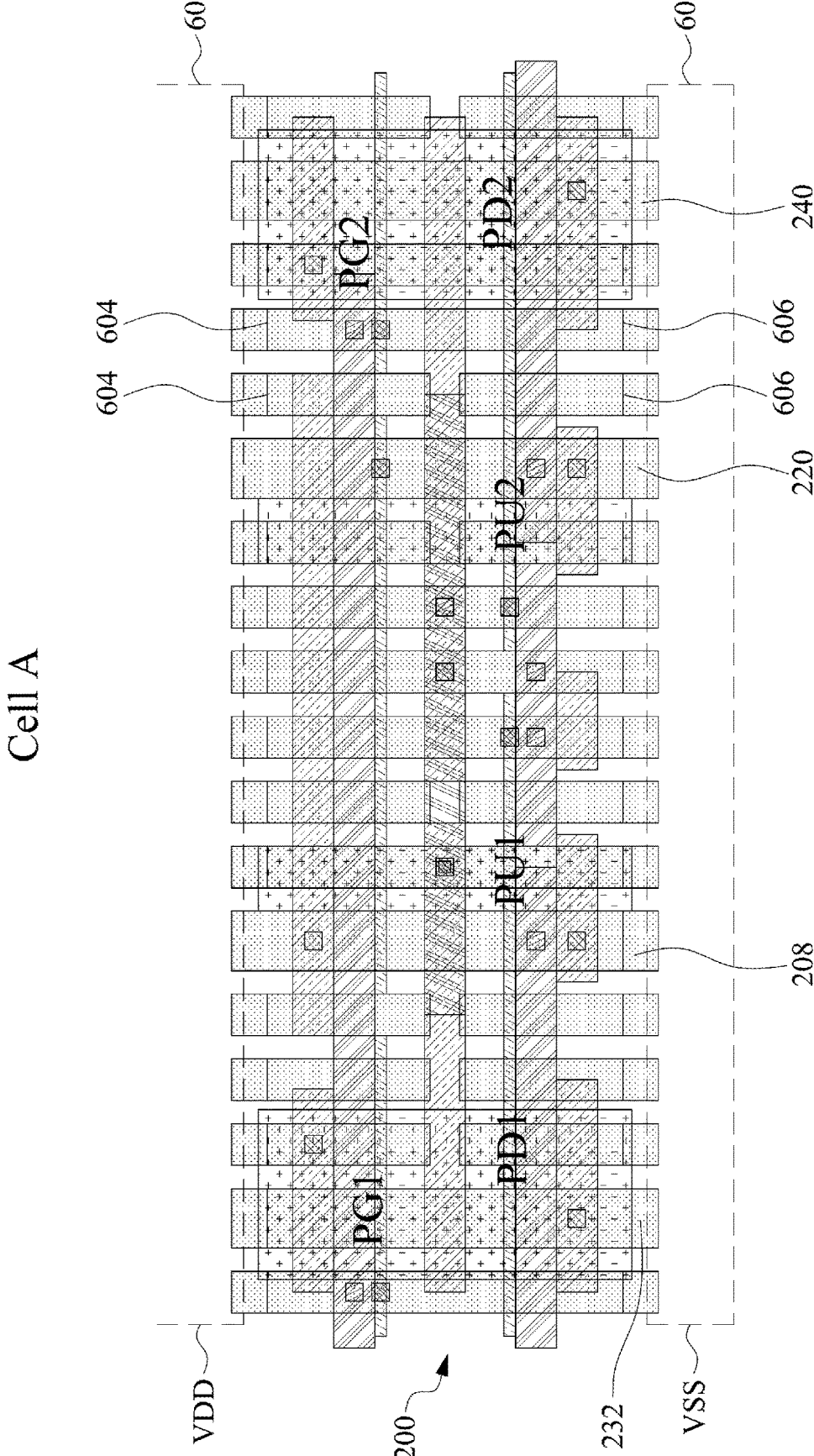
FIG. 11 is a diagram schematically illustrating the 6T SRAM circuit layout (cell A) including a VDD power rail and a VSS reference rail, in accordance with some embodiments.

FIG. 11 is a diagram schematically illustrating the 6T SRAM circuit layout 200 (cell A) including a VDD power rail 600 and a VSS reference rail 602, in accordance with some embodiments. The 6T SRAM circuit layout 200 designed and manufactured with the logic rules and technology is connected directly to each of the VDD power rail 600 and the VSS reference rail 602 through M0 layer tracks.

The VDD power rail 600 is electrically connected to M0 layer tracks 208 and 220, and the rest of the M0 layer tracks are cut, as indicated at 604, such that they are not connected to the VDD power rail 600. The VSS reference rail 602 is electrically connected to M0 layer tracks 232 and 240, and the rest of the M0 layer tracks are cut, as indicated at 606, such that they are not connected to the VSS reference rail 602.

In this manner, the 6T SRAM circuit layout 200, designed and manufactured in accordance with the logic rules and technology, is robustly connected to VDD power 600 and the VSS reference 602.

Figure 12:
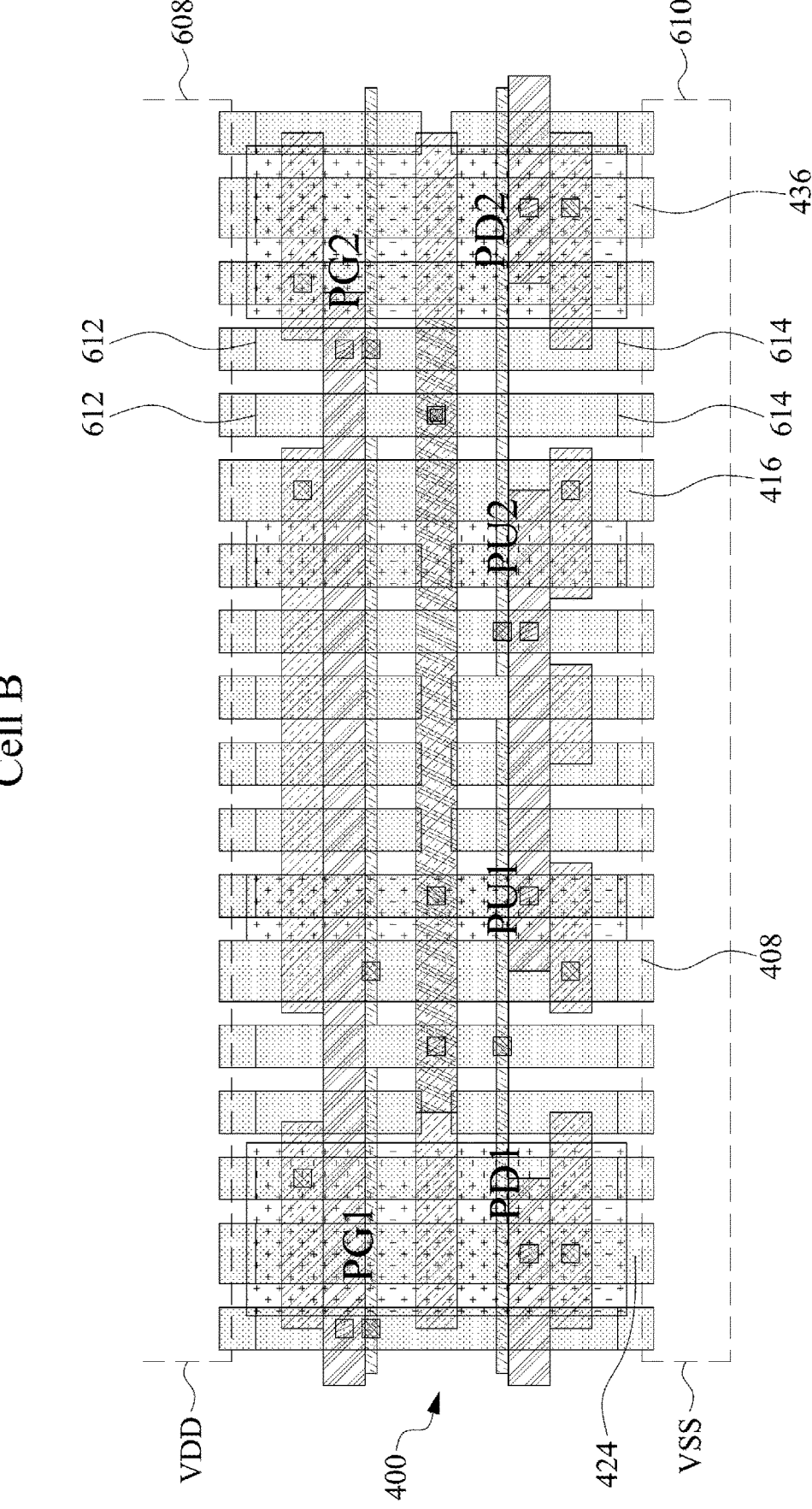
FIG. 12 is a diagram schematically illustrating the 6T SRAM circuit layout (cell B) including a VDD power rail and a VSS reference rail, in accordance with some embodiments.

FIG. 12 is a diagram schematically illustrating the 6T SRAM circuit layout 400 (cell B) including a VDD power rail 608 and a VSS reference rail 610, in accordance with some embodiments. The 6T SRAM circuit layout 400 designed and manufactured with the logic rules and technology is connected directly to each of the VDD power rail 608 and the VSS reference rail 610 through M0 layer tracks.

The VDD power rail 608 is electrically connected to M0 layer tracks 408 and 416, and the rest of the M0 layer tracks are cut, as indicated at 612, such that they are not connected to the VDD power rail 608. The VSS reference rail 610 is electrically connected to M0 layer tracks 424 and 436, and the rest of the M0 layer tracks are cut, as indicated at 614, such that they are not connected to the VSS reference rail 610.

In this manner, the 6T SRAM circuit layout 400, designed and manufactured in accordance with the logic rules and technology, is robustly connected to VDD power 608 and the VSS reference 610.

Figure 13:
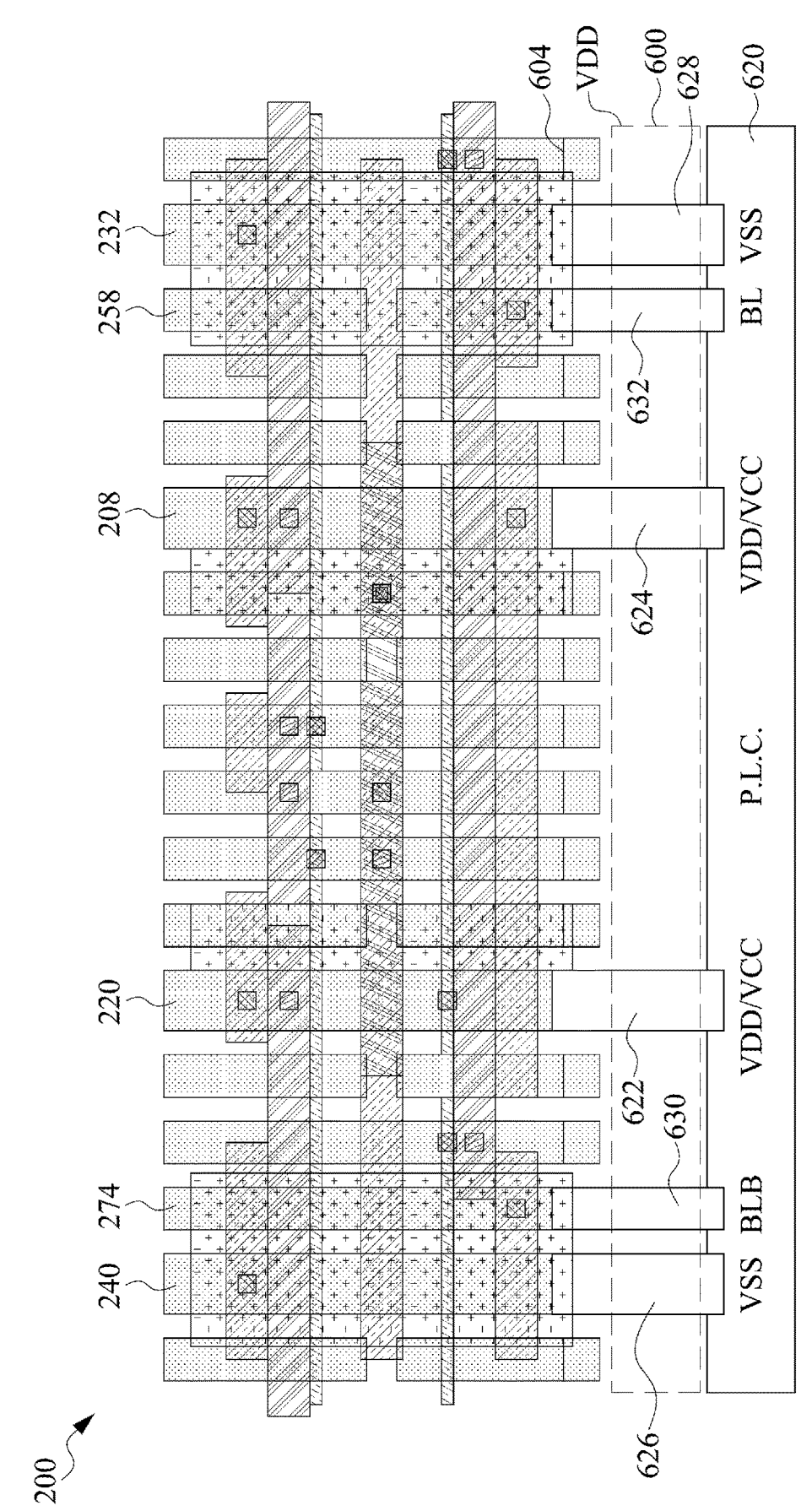
FIG. 13 is a diagram schematically illustrating the 6T SRAM circuit layout (cell A) connected to a peripheral logic circuit, in accordance with some embodiments.

FIG. 13 is a diagram schematically illustrating the 6T SRAM circuit layout 200 (cell A) connected to a peripheral logic circuit 620, in accordance with some embodiments. The 6T SRAM circuit layout 200 includes the VDD power rail 600.

The 6T SRAM circuit layout 200 benefits from FEOL, MEOL, and BEOL simple abutment with neighboring logic devices, such that the 6T SRAM circuit layout 200 can be integrated into or situated adjacent the configuration device 22 and other neighboring logic devices. Also, the 6T SRAM circuit layout 200 includes conductive tracks, such as M0 layer tracks, that align with power lines, reference lines, and data lines, such as bit lines BLs and bit line bars BLBs, to provide simple and robust connections.

The 6T SRAM circuit layout 200 is electrically connected to the VDD power rail 600 and to the VSS reference rail 602 (not shown in FIG. 13). The VDD power rail 600 is electrically connected to M0 layer tracks 208 and 220, and the rest of the M0 layer tracks are cut, as indicated at 604, such that they are not connected to the VDD power rail 600.

The peripheral logic circuit 620 is electrically connected to the 6T SRAM circuit layout 200. The VDD (VCC) power is electrically connected from the 6T SRAM circuit layout 200 to the peripheral logic circuit 620 through the M0 layer track 220 and a VDD conductive layer track 622, and through the M0 layer track 208 and a VDD conductive layer track 624. The VSS reference is electrically connected from the 6T SRAM circuit layout 200 to the peripheral logic circuit 620 through the M0 layer track 240 and a VSS conductive layer track 626, and through the M0 layer track 232 and a VSS conductive layer track 628. The data lines, including bit line BL and bit line bar BLB, are electrically connected from the 6T SRAM circuit layout 200 to the peripheral logic circuit 620 through the M0 layer track 274 and BLB conductive layer track 630, and through the M0 layer track 258 and a BL conductive layer track 632. In some embodiments, VDD/VCC, VSS, BL, and BLB are electrically connected from the 6T SRAM circuit layout 200 to the peripheral logic circuit 620 by M0 layer tracks. In some embodiments, the VDD conductive layer tracks 622 and 624 are M0 layer tracks. In some embodiments, the VSS conductive layer tracks 626 and 628 are M0 layer tracks. In some embodiments, the BL conductive layer track 632 is an M0 layer track. In some embodiments, the BLB conductive layer track 630 is an M0 layer track.

In this manner, the 6T SRAM circuit layout 200, designed and manufactured in accordance with the logic rules and technology, can be integrated and connected to the peripheral logic circuit 620.

Figure 14:
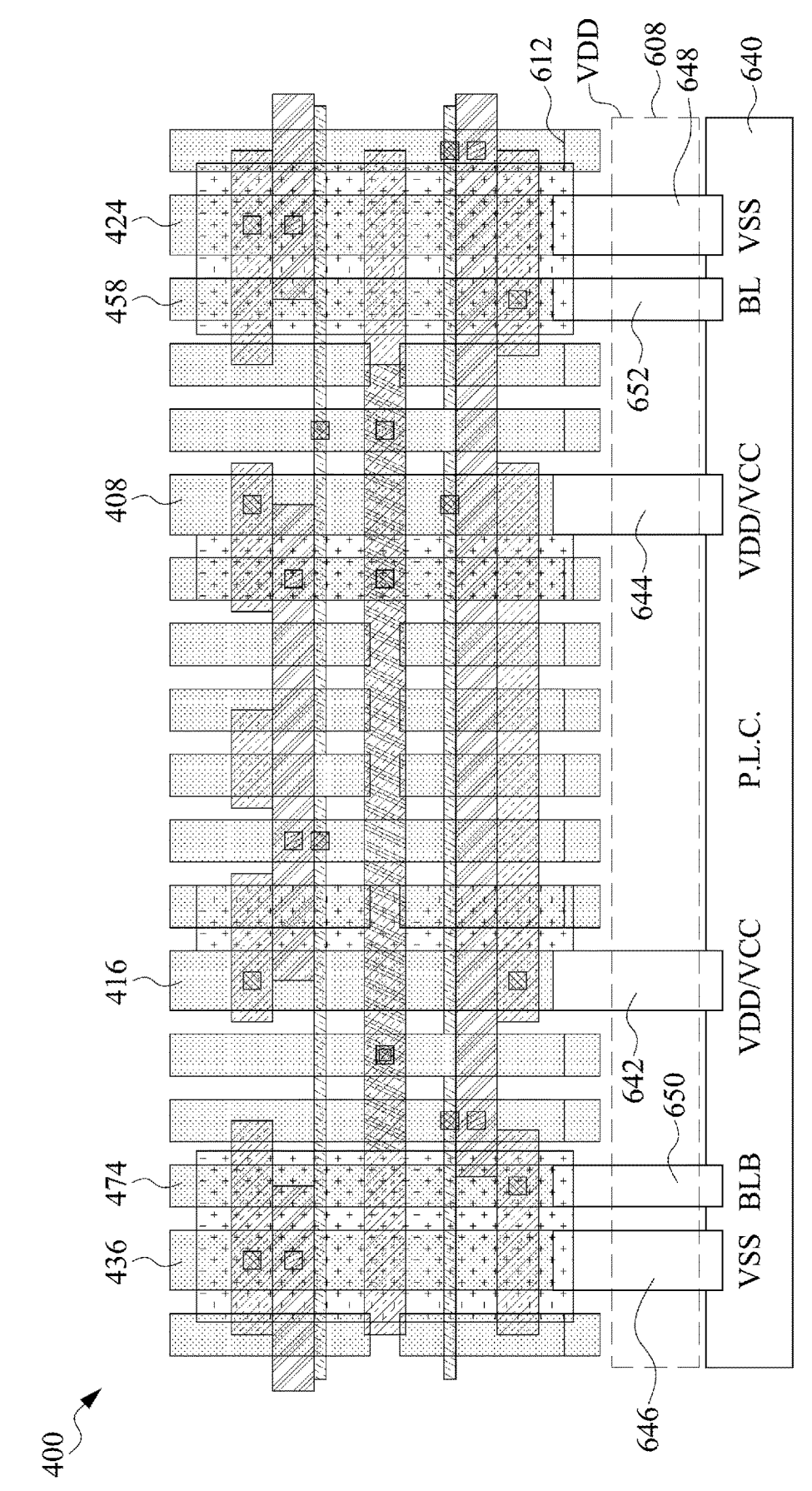
FIG. 14 is a diagram schematically illustrating the 6T SRAM circuit layout (cell B) connected to a peripheral logic circuit, in accordance with some embodiments.

FIG. 14 is a diagram schematically illustrating the 6T SRAM circuit layout 400 (cell B) connected to a peripheral logic circuit 640, in accordance with some embodiments. The 6T SRAM circuit layout 400 includes the VDD power rail 608.

The 6T SRAM circuit layout 400 benefits from FEOL, MEOL, and BEOL simple abutment with neighboring logic devices, such that the 6T SRAM circuit layout 400 can be integrated into or situated adjacent the configuration device 22 and other neighboring logic devices. Also, the 6T SRAM circuit layout 400 includes conductive tracks, such as M0 layer tracks, that align with power lines, reference lines, and data lines, such as bit lines BLs and bit line bars BLBs, to provide simple and robust connections.

The 6T SRAM circuit layout 400 is electrically connected to the VDD power rail 608 and to the VSS reference rail 610 (not shown in FIG. 14). The VDD power rail 608 is electrically connected to M0 layer tracks 416 and 408, and the rest of the M0 layer tracks are cut, as indicated at 612, such that they are not connected to the VDD power rail 608.

The peripheral logic circuit 640 is electrically connected to the 6T SRAM circuit layout 400. The VDD (VCC) power is electrically connected from the 6T SRAM circuit layout 400 to the peripheral logic circuit 640 through the M0 layer track 416 and a VDD conductive layer track 642, and through the M0 layer track 408 and a VDD conductive layer track 644. The VSS reference is electrically connected from the 6T SRAM circuit layout 400 to the peripheral logic circuit 640 through the M0 layer track 436 and a VSS conductive layer track 646, and through the M0 layer track 424 and a VSS conductive layer track 648. The data lines, including bit line BL and bit line bar BLB, are electrically connected from the 6T SRAM circuit layout 400 to the peripheral logic circuit 640 through the M0 layer track 474 and BLB conductive layer track 650, and through the M0 layer track 458 and a BL conductive layer track 652.

In this manner, the 6T SRAM circuit layout 400, designed and manufactured in accordance with the logic rules and technology, can be integrated and connected to the peripheral logic circuit 640.

Figure 15:
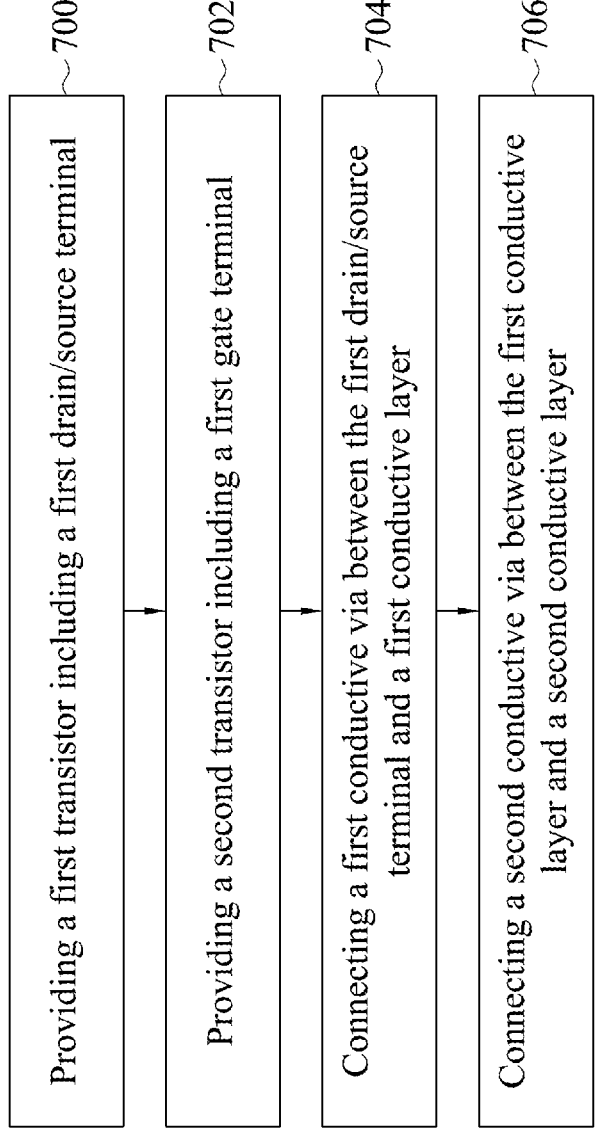
FIG. 15 is a diagram schematically illustrating a method of connecting transistors in an SRAM, in accordance with some embodiments.

FIG. 15 is a diagram schematically illustrating a method of connecting transistors in an SRAM, in accordance with some embodiments. At 700, the method includes providing, in the SRAM, a first transistor (such as one of PG1, PU1, and PD1 shown in FIGS. 3A, 6, and 7) including a first drain/source terminal (one of 276 and 278). At 702, the method includes providing a second transistor (one of PU2 and PD2) including a first gate terminal (282 at node Q).

At 704, the method includes connecting, in a first conductive path (330), a first conductive via (such as VD via 284 shown in FIG. 8) between the first drain/source terminal (one of 276 and 278 covered by MD layer 280) and a first conductive layer (M0 layer track 286). At 706, the method includes connecting a second conductive via (VIA0 via 288) between the first conductive layer (M0 layer track 286) and a second conductive layer (M1 layer track 290).

In some embodiments, the method further includes connecting, in the first conductive path (330), a third conductive via (VG via 296) between the first gate terminal (poly gate 282) of the second transistor (one of PU2 and PD2) and a third conductive layer (M0 layer track 294), and connecting a fourth conductive via (VIA0 via 292) between the second conductive layer (M1 layer track 290) and the third conductive layer (M0 layer track 294). In some embodiments, the first conductive layer and the third conductive layer are different tracks of the same conductive layer. In some embodiments, the first conductive layer and the third conductive layer are different conductive layers, such as M0_a and M0_b. In some embodiments, the method includes connecting at least one of the first conductive layer and the third conductive layer directly to a configuration device and/or neighboring logic devices.

In some embodiments, the method includes providing, in the SRAM, a third transistor (one of PG2, PU2, and PD2) including a second drain/source terminal (one of 298 and 300) and a fourth transistor (one of PU1 and PD1) including a second gate terminal (304 at node QB), where the method includes connecting, in a second conductive path (332), a fifth conductive via between the second drain/source terminal and a fourth conductive layer and connecting a sixth conductive via between the fourth conductive layer and a fifth conductive layer. In some embodiments, the first conductive path (330) and the second conductive path (332) have similar RC characteristics, such that the first conductive path (330) and the second conductive path (332) are balanced to provide reduced mismatch and improved operation margins.

In some embodiments, the method includes producing each of the first transistor, the second transistor, and the first conductive path using extreme ultraviolet lithography.

Disclosed embodiments thus provide that the configuration device 22 and the SRAM-based FPGA 24, including the SRAM memory cell 46, are designed and manufactured in accordance with the logic rules and technology. The SRAM memory cell 46 designed and manufactured with the logic rules and technology is more easily integrated with the configuration device 22 and other peripheral logic devices. Also, the SRAM memory cell 46 provides more robust power line and reference line connections, benefits from FEOL, MEOL, and BEOL simple abutment with neighboring logic devices, and with the FEOL/MEOL/BEOL patterns provides uniformity of lines and space push, i.e., consolidation of wiring and layouts within a limited space.

Disclosed embodiments are directed to a 6T SRAM memory cell 46 designed and manufactured in accordance with the logic rules and technology. Embodiments include a first 6T SRAM circuit layout 200, cell A, and a second 6T SRAM circuit layout 400, cell B. In each of cell A and cell B, the 6T SRAM circuit includes MEOL vias connected to BEOL conductive layers to provide two conductive paths that are RC balanced to reduce mismatch and provide better circuit operation margins. Also, each of cell A and cell B includes conductive tracks that align with the VDD power rail and the VSS reference rail to provide more robust connections to VDD power and the VSS reference. In addition, the 6T SRAM circuit layouts 200 and 400 can be directly connected, without a jumper, to other logic devices, which provides improved PPA.

In accordance with some embodiments, a device includes a first transistor including a first drain/source terminal and a second transistor including a first gate terminal. A first conductive path is electrically connected between the first drain/source terminal and the first gate terminal. The first conductive path includes a first conductive via electrically connected between the first drain/source terminal and a first track of a first conductive layer, and a second conductive via electrically connected between the first track of the first conductive layer and a first track of a second conductive layer.

In accordance with further embodiments, a memory device includes a static random-access memory that includes a first transistor including a drain/source terminal and a second transistor including a gate terminal. A conductive path is electrically connected between the drain/source terminal and the gate terminal. The conductive path includes a first conductive via electrically connected between the drain/source terminal and a first track of a first conductive layer, a second conductive via electrically connected between the first track of the first conductive layer and a track of a second conductive layer, a third conductive via electrically connected between the gate terminal and a first track of a third conductive layer, and a fourth conductive via electrically connected between the first track of the third conductive layer and the track of the second conductive layer, wherein at least one of a second track of the first conductive layer and a second track of the third conductive layer align with at least one of a power rail and a reference rail.

In accordance with still further disclosed aspects, a method of connecting transistors in a static random-access memory. The method includes providing, in the static random-access memory, a first transistor including a first drain/source terminal and a second transistor including a first gate terminal; connecting, in a first conductive path, a first conductive via between the first drain/source terminal and a first track of a first conductive layer; and connecting a second conductive via between the first track of the first conductive layer and a track of a second conductive layer.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

first and second transistors of opposite conductivity types, the first and second transistors sharing a first gate terminal, the first transistor including a first drain/source terminal, the first gate terminal extending longitudinally along a first direction;

third and fourth transistors of opposite conductivity types, the third and fourth transistors sharing a second gate terminal, the third transistor including a second source/drain terminal, the second gate terminal extending longitudinally along the first direction; and a first conductive path electrically connected between the first drain/source terminal and the second gate terminal, wherein an extension of a centerline of the first gate terminal along the first direction intersects an edge of the second gate terminal, and wherein the first conductive path includes:

a first conductive via electrically connected between the first drain/source terminal and a first track of a first conductive layer; and a second conductive via electrically connected between the first track of the first conductive layer and a first track of a second conductive layer positioned above the first conductive layer.

2. The memory device of claim 1, wherein the first conductive path further includes:

a third conductive via electrically connected between the second gate terminal and a second track of the first conductive layer; and a fourth conductive via electrically connected between the first track of the second conductive layer and the second track of the first conductive layer.

3. The memory device of claim 2, comprising:

a second conductive path electrically connected between the second drain/source terminal and the first gate terminal, wherein the second conductive path includes:

a fifth conductive via electrically connected between the second drain/source terminal and a third track of the first conductive layer; and a sixth conductive via electrically connected between the third track of the first conductive layer and a second track of the second conductive layer.

4. The memory device of claim 3, wherein the second conductive path further includes:

a seventh conductive via electrically connected between the first gate terminal and a fourth track of the first conductive layer; and an eighth conductive via electrically connected between the second track of the second conductive layer and the fourth track of the first conductive layer.

5. The memory device of claim 1, wherein each of the first transistor and the second transistor is one of a finfet and a stacked nanosheet transistor.

6. A memory device, comprising:

a static random-access memory (SRAM) cell including:

a first transistor including a first gate terminal and a drain/source terminal, the first gate terminal extending lengthwise along a first direction;

a second transistor including a second gate terminal, the second gate terminal extending lengthwise along the first direction;

a conductive path electrically connected between the drain/source terminal and the second gate terminal, the conductive path including:

a first conductive via electrically connected between the drain/source terminal and a first track of a first conductive layer;

a second conductive via electrically connected between the first track of the first conductive layer and a track of a second conductive layer;

a third conductive via electrically connected between the second gate terminal and a first track of a third conductive layer; and a fourth conductive via electrically connected between the first track of the third conductive layer and the track of the second conductive layer, wherein the first transistor is a pull-down (PD) transistor of the SRAM cell and the second transistor is a pull-up (PU) transistor of the SRAM cell, wherein an extension of a centerline of the first gate terminal along the first direction intersects an edge of the second gate terminal, and wherein at least one of a second track of the first conductive layer and a second track of the third conductive layer align with at least one of a power rail and a reference rail.

7. The memory device of claim 6, wherein at least one of a third track of the first conductive layer and a third track of the third conductive layer are configured to be directly connected to neighboring logic circuits.

8. The memory device of claim 6, wherein the static random-access memory is configured to directly abut neighboring logic devices.

9. The memory device of claim 6, comprising a configuration device and a flash memory, wherein the configuration device is configured to load the static random-access memory from the flash memory on power up.

10. The memory device of claim 6, wherein the first conductive layer and the third conductive layer are the same conductive layer.

11. A method for forming a memory device, comprising:

providing, in a static random-access memory (SRAM) cell, a first transistor including a first gate terminal and a first drain/source terminal and a second transistor including a second gate terminal, each of the first and second gate terminals extending longitudinally along a first direction, each of the first and second transistors disposed on a straight line extending along the first direction, an extension of a centerline of the first gate terminal along the first direction intersecting an edge of the second gate terminal, wherein the first transistor is a pull-down (PD) transistor of the SRAM cell and the second transistor is a pull-up (PU) transistor of the SRAM cell;

connecting, in a first conductive path, a first conductive via between the first drain/source terminal and a first track of a first conductive layer; and connecting a second conductive via between the first track of the first conductive layer and a track of a second conductive layer.

12. The method of claim 11, comprising:

connecting, in the first conductive path, a third conductive via between the second gate terminal of the second transistor and a first track of a third conductive layer; and connecting a fourth conductive via between the track of the second conductive layer and the first track of the third conductive layer.

13. The method of claim 11, comprising:

providing, in the static random-access memory, a third transistor including a second drain/source terminal and a fourth transistor including a third gate terminal;

connecting, in a second conductive path, a fifth conductive via between the second drain/source terminal and a track of a fourth conductive layer; and connecting a sixth conductive via between the track of the fourth conductive layer and a track of a fifth conductive layer.

14. The method of claim 11, comprising manufacturing each of the first transistor, the second transistor, and the first conductive path using extreme ultraviolet lithography.

15. The method of claim 11, comprising:

connecting at least one of a second track of the first conductive layer and a second track of the third conductive layer directly to neighboring logic devices.

16. The method of claim 11, wherein the static random-access memory is manufactured according to logic rules and technology.

17. The memory device of claim 1, wherein the first transistor and the second transistor are both disposed on a straight line extending along the first direction.

18. The memory device of claim 1, wherein the first, second, third, and fourth transistors are positioned in a same memory cell.

19. The memory device of claim 1, wherein the first transistor is a first pull-down (PD) transistor of a memory cell, the second transistor is a first pull-up (PU) transistor of the memory cell, the third transistor is a second PD transistor of the memory cell, and the fourth transistor is a second PU transistor of the memory cell.

20. The memory device of claim 3, wherein measured along the first direction a length of the first track of the second conductive layer is longer than a length of the second track of the second conductive layer.

* * * * *